(12) United States Patent
Iwasaki et al.

(10) Patent No.: US 7,414,495 B2
(45) Date of Patent: Aug. 19, 2008

(54) COUPLED FBAR FILTER

(75) Inventors: Tomohiro Iwasaki, Osaka (JP); Hiroshi Nakatsuka, Osaka (JP); Keiji Onishi, Osaka (JP); Hiroyuki Nakamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 293 days.

(21) Appl. No.: 11/453,070

(22) Filed: Jun. 15, 2006

(65) Prior Publication Data

US 2006/0284703 A1    Dec. 21, 2006

(30) Foreign Application Priority Data

Jun. 17, 2005  (JP)  ............................. 2005-177729

(51) Int. Cl.
*H03H 9/00*  (2006.01)
(52) U.S. Cl. .................. 333/133; 333/187; 333/189
(58) Field of Classification Search ................. 333/133, 333/187, 189; 310/334
See application file for complete search history.

(56) References Cited

U.S. PATENT DOCUMENTS 7,053,730 B2 * 5/2006 Park et al. ................. 333/133
7,233,218 B2 * 6/2007 Park et al. ................. 333/133

FOREIGN PATENT DOCUMENTS

| JP | 2000-269780 | 9/2000 |
| JP | 2001-053580 | 2/2001 |
| JP | 2002-232236 | 8/2002 |
| JP | 2002-252549 | 9/2002 |
| JP | 2003-092526 | 3/2003 |
| JP | 2003-188680 | 7/2003 |

* cited by examiner

*Primary Examiner*—Daniel D Chang
(74) *Attorney, Agent, or Firm*—Wenderoth, Lind & Ponack, L.L.P.

(57) ABSTRACT

In a balanced/unbalanced type coupled FBAR filter 100, an area size of a first lower electrode 102 is generally equal to a total area size of second and third lower electrodes 104 and 106 and an area for isolating the second and third lower electrodes 104 and 106. An area size of a first upper electrode 103 is generally equal to a total area size of second and third upper electrodes 105 and 107 and an area for isolating the second and third upper electrodes 105 and 107. The third lower electrode 106 and the second upper electrode 105 are located to face each other, and the third upper electrode 107 and the second lower electrode 104 are located to face each other. A part of the second lower electrode 104 and a part of the second upper electrode 105 are located to face each other.

11 Claims, 21 Drawing Sheets

F I G. 1 5 A  PRIOR ART
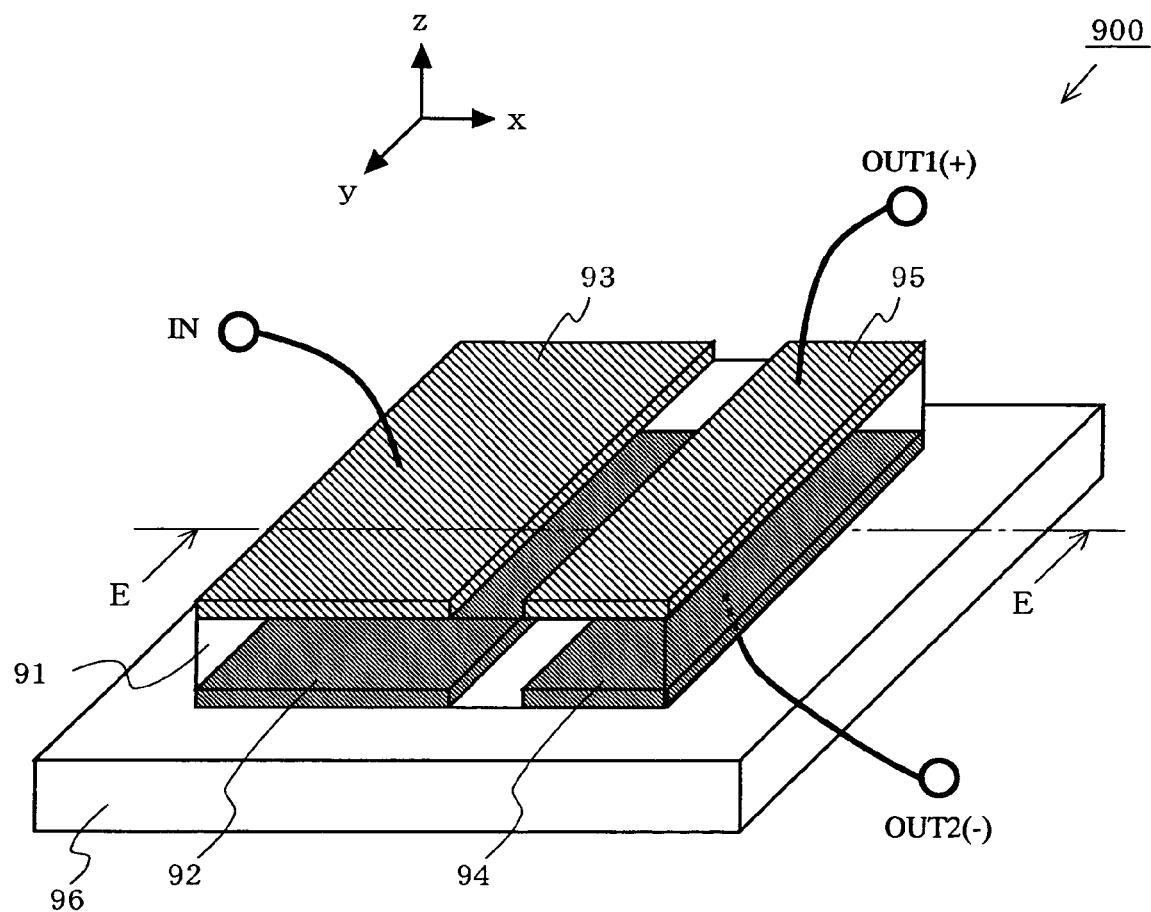

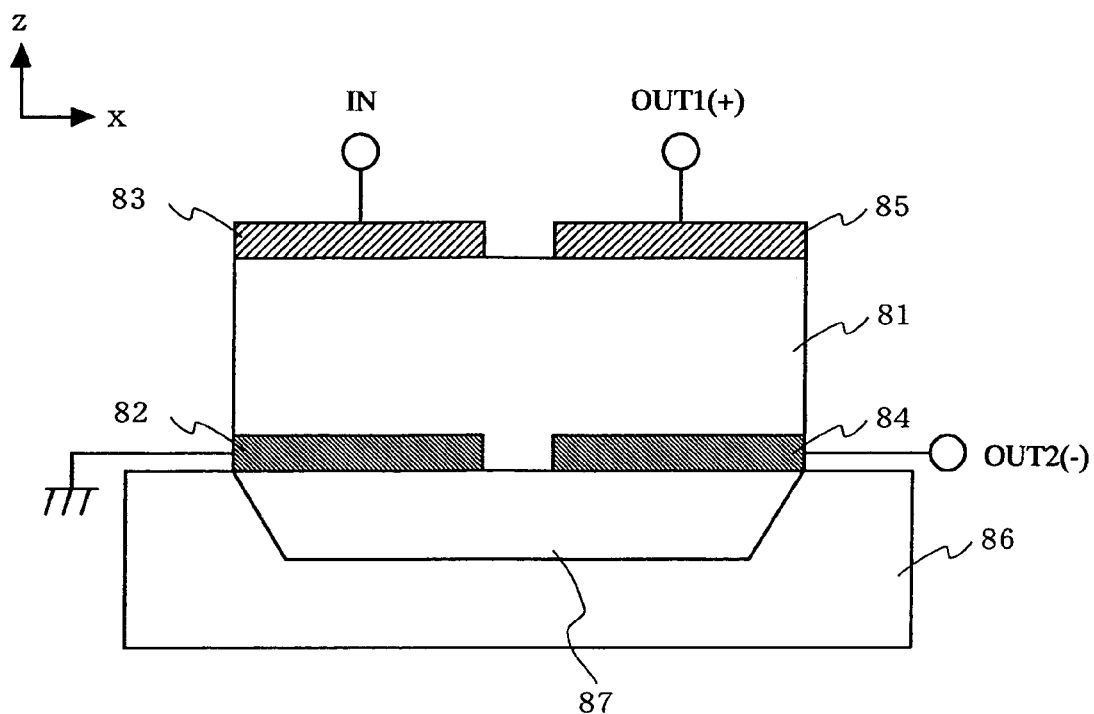
F I G. 1 6 B  PRIOR ART

US 7,414,495 B2

COUPLED FBAR FILTER

BACKGROUND OF THE INVENTION

1. Field of the Invention

The present invention relates to a coupled FBAR filter usable for balancing; and a ladder-type filter, a duplexer and a communication device including such a coupled FBAR filter.

2. Description of the Background Art

Conventionally, filters mounted on wireless communication devices such as cellular phones include dielectric filters, laminated filters and acoustic filters. Known acoustic filters include a monolithic crystal filter (MCF) using a plurality of modes of a bulk wave and a surface acoustic wave filter (SAW filter). Recently, filters are required to have a smaller size, to provide a higher performance and to be usable at a higher frequency. As a device for fulfilling these requirements, a film bulk acoustic resonator filter (FBAR filter) using a bulk wave of a piezoelectric thin film has been developed. As an FBAR filter, a coupled FBAR filter realized by multiplexing a plurality of modes is proposed.

Recently, a balancing performance of semiconductor components such as ICs has been enhanced for the purpose of improving the signal-to-noise characteristic, and an FBAR used at an RF stage and a filter including such the FBAR are now desired to provide a better balancing performance.

Also recently, it has been desired to control the impedance of an FBAR filter in order to match the impedance with ICs located at stages before and after the FBAR filter.

A conventional balanced type MCF using a plurality of modes (Japanese Laid-Open Patent Publication No. 2001-53580) will be described. FIG. 12 shows a structure of the conventional balanced type MCF.

The MCF includes three electrode pairs, i.e., the electrode pair 72/76, the electrode pair 73/74, and the electrode pair 75/77. The electrodes of each pair face each other with a crystal substrate 71 (piezoelectric substrate) interposed therebetween. The electrode 72 on the left is an input electrode, and the electrode 73 on the right is an output electrode. The input electrode 72 and the assisting electrode 76 facing the input electrode 72 are respectively connected to input balanced terminals 711 and 713, and the output electrode 73 and the assisting electrode 74 facing the output electrode 73 are respectively connected to output balanced terminals 714 and 712. The MCF excites a first-order thickness vibration and a third-order thickness vibration and thus realizes a high coupling degree of the plurality of modes. Thus, a balanced type filter usable over a wide band and having a high attenuation between the input balanced terminals and the output balance terminals is realized.

A method for controlling the impedance of a conventional balanced type filter (Japanese Laid-Open Patent Publication No. 2003-92526) will be described. FIG. 13 shows a structure for controlling the impedance of balanced terminals in a conventional balanced type SAW filter.

The SAW filter has a pattern of electrodes crossing in a periodical strip-line manner on a piezoelectric substrate 601. Owing to this pattern of electrodes, an acoustic surface wave can be excited. On the piezoelectric substrate 601, a longitudinal-mode SAW filter including input IDT electrodes 602a and 602b, reflector electrodes 603a and 603b, and an output IDT electrode 604 is provided. Upper electrodes of the input IDT electrodes 602a and 602b are connected to an input terminal S, and lower electrodes of the input IDT electrodes 602a and 602b are grounded. The output IDT electrode 604 is divided into three, i.e., first, second and third divided IDT electrodes 604a, 604b and 604c. The output IDT electrode 604 is formed of a group of the three IDT electrodes 604a, 604b and 604c connected to each other. The first through third divided IDT electrodes 604a, 604b and 604c are located to have the same phase. Upper electrodes 605a and 605b of the first and second divided IDT electrodes 604a and 604b are electrically connected to each other and are also connected to one balanced output terminal T1. Lower electrodes 606b and 606c of the second and third divided IDT electrodes 604b and 604c are electrically connected to each other and are also connected to the other balanced output terminal T2.

FIG. 14 shows a capacitance equivalent circuit diagram between the output balanced terminals of the balanced type SAW filter shown in FIG. 13. Capacitances Ca through Cc are respectively capacitances of the first through third divided IDT electrodes 604a through 604c, and a synthesized capacitance of the capacitances Ca through Cc is a total capacitance Cout of the output IDT electrode 604. By varying the logarithm of the electrode fingers included in the output IDT electrode 604, the value of the total capacitance Cout can be controlled. Since the impedance of the SAW filter dominantly depends on the capacitances of the IDT electrodes, the impedance between the output balanced terminals can be controlled by varying the logarithm of the first through third divided IDT electrodes 604a through 604c.

Hereinafter, a method for controlling the impedance of a conventional coupled FBAR filter having balanced/unbalanced conversion type input and output terminals will be described.

FIG. 15A is an isometric view showing a structure of a conventional balanced/unbalanced type coupled FBAR filter 900. FIG. 15B is a cross-sectional view of the conventional balanced/unbalanced type coupled FBAR filter 900 shown in FIG. 15A taken along line E-E.

The conventional balanced/unbalanced type coupled FBAR filter 900 includes first and second lower electrodes 92 and 94, a piezoelectric thin film 91, and first and second upper electrodes 93 and 95, which are provided on a substrate 90. The first lower electrode 92, the first upper electrode 93, and the piezoelectric thin film 91 interposed between these electrodes form a first vibration section. The first upper electrode 93 is used as an input terminal, and the first lower electrode 92 is used as a GND terminal. The second lower electrode 94, the second upper electrode 95, and the piezoelectric thin film 91 interposed between these electrodes form a second vibration section. The second upper electrode 95 is used as an output balanced terminal (+), and the second lower electrode 94 is used as an output balanced terminal (−). The substrate 90 has a cavity 96 formed therein, which is capable of commonly guaranteeing vibrations of the first and second vibration sections and coupling the vibrations. Owing to this, for example, the second vibration section on the output side excites a mechanical vibration by the mechanical vibration excited in the first vibration section on the input side, and second vibration section on the output side further converts the excited mechanical vibration into an electric signal and outputs the electric signal.

In general, the vibration excited in a thickness direction in the second vibration section on the output side is at $\lambda/2$. Where the resonant frequency in the second vibration section is fr and the average sonic speed in the thickness direction is V, the wavelength $\lambda$ is represented by V/fr. Accordingly, in the case where the second vibration section is designed to have such a thickness as to obtain the resonant frequency fr, an electric signal which is output from a top surface of the piezoelectric thin film 91 and an electric signal which is output from a bottom surface of the piezoelectric thin film 91 at the resonant frequency fr would ideally have a phase difference of 180 degrees and an amplitude difference of 180 degrees. Therefore, a single phase electric signal which is input to an input terminal IN1 is converted into differential electric signals by the balanced/unbalanced type coupled FBAR filter 900 and is output from output terminals OUT1(+) and OUT2(−).

The second lower electrode 94 and the second upper electrode 95 are respectively shorter in an x direction than the first lower electrode 92 and the first upper electrode 93. Owing to this, the electrode area size is decreased, and thus an effect of reducing the damping capacitances which form parallel capacitances of the equivalent circuit is provided. Therefore, the impedance at the output balanced terminals can be increased.

FIG. 16A is an isometric view showing a structure of another conventional balanced/unbalanced type coupled FBAR filter 800. FIG. 16B is a cross-sectional view of the conventional balanced/unbalanced type coupled FBAR filter 800 shown in FIG. 16A taken along line F-F. The structure of the balanced/unbalanced type coupled FBAR filter 800 is different from that of the balanced/unbalanced type coupled FBAR filter 900 only in the shape of the second upper electrode and the second lower electrode. The principle of controlling the impedance is the same and will not be repeated here.

FIG. 17 shows ideal vibration mode distributions of the conventional balanced/unbalanced type coupled FBAR filter 900 shown in FIG. 15A and FIG. 15B. An integral value of the vibration mode distribution curves is generally equivalent to the amount of charge generated in the piezoelectric thin film 91. By efficiently using the generated charge for the vibrations in the two vibration sections, the coupling coefficient of each vibration section can be increased, and smaller-loss and wider-band characteristics can be realized.

However, in the balanced/unbalanced type coupled FBAR filter 900, the area size of the second lower electrode 94 and the second upper electrode 95 is smaller than the area size of the first lower electrode 92 and the first upper electrode 93. Therefore, the amount of charge generated in the second vibration section is smaller. For this reason, the charge generated in the first vibration section cannot be efficiently used in the second vibration section, which increases the loss and narrows the resonant frequency band. The balanced/unbalanced type coupled FBAR filter 900 can significantly convert the impedance, but has a problem that the loss is increased and the resonant frequency band is narrowed.

FIG. 18 shows ideal vibration mode distributions of the conventional balanced/unbalanced type coupled FBAR filter 800 shown in FIG. 16A and FIG. 16B. In the balanced/unbalanced type coupled FBAR filter 800, there is a discontinuous surface between the first vibration section and the second vibration section with respect to the vibration propagating in the x direction. On the discontinuous surface, an unnecessary mode is generated. In addition, the ratio in an area above the cavity occupied by a non-electrode portion is higher than that in the conventional balanced/unbalanced type coupled FBAR filter 900. In other words, the electrode area size of the second vibration section is smaller than the electrode area size of the first vibration section. Therefore, the charge generated in the first vibration section cannot be efficiently used in the second vibration section. This increases the loss, narrows the resonant frequency band, and thus deteriorates the characteristics. The balanced/unbalanced type coupled FBAR filter 800 can significantly convert the impedance, but has a problem that the loss is increased, the unnecessary mode is generated, and the resonant frequency band is narrowed.

SUMMARY OF THE INVENTION

Therefore, an object of the present invention is to provide a balanced/unbalanced type coupled FBAR filter efficiently using the generated charge in input/output vibration sections, having superb characteristics and controlling the impedance.

The present invention is directed to a balanced/unbalanced type coupled FBAR filter for performing conversion between a balanced signal and an unbalanced signal using FBARs or a balanced/balanced type coupled FBAR filter for performing conversion between a balanced signal and a balanced signal using FBARs. For attaining the above object, a coupled FBAR filter according to the present invention comprises a first vibration section including an FBAR; a second vibration section including an FBAR and located parallel to the first vibration section; and a common vibration guaranteeing section, having the first and second vibration sections provided thereon, for commonly guaranteeing a vibration of the first vibration section and a vibration of the second vibration section so as to couple the two vibrations.

The first vibration section includes a first lower electrode; a first upper electrode located to face the first lower electrode; and a part of a piezoelectric thin film interposed between the first lower electrode and the first upper electrode. At least one of the first lower electrode and the first upper electrode is used as an input/output terminal. The second vibration section includes a second lower electrode; a third lower electrode separated from the second lower electrode by an insulating area; a second upper electrode located to face a part of the third lower electrode; a third upper electrode located to face a part of the second lower electrode and separated from the second upper electrode by an insulating area; and another part of the piezoelectric thin film interposed between the second and third lower electrodes and the second and third upper electrodes. The second lower electrode and the second upper electrode are both used as an input/output terminal. An area size of the first lower electrode is generally equal to a total area size of the second and third lower electrodes and the area for isolating the second and third lower electrodes; an area size of the first upper electrode is generally equal to a total area size of the second and third upper electrodes and the area for isolating the second and third upper electrodes; and a part of the second lower electrode and a part of the second upper electrode are located to face each other.

The present invention may be provided as a ladder-type filter, a duplexer, or a communication device including the above-described coupled FBAR filter.

According to the present invention, the total area of the electrodes forming the first vibration section is generally equal to the total area of the electrodes forming the second vibration section. Therefore, the loss of the vibration propagated from the vibration section on the input side to the Preferably, an area size of the third lower electrode is generally equal to an area size of the third upper electrode; and thus the third lower electrode and the third upper electrode are located to be rotation-symmetrical with respect to a central axis in a thickness direction of the second vibration section. The common vibration guaranteeing section is a cavity formed in a substrate, or an acoustic mirror layer including a high acoustic impedance layer and a low acoustic impedance layer located alternately. vibration section on the output side can be prevented, and thus the resonant frequency band can be widened. Since the first vibration section and the second vibration section face each other, generation of an unnecessary mode can be prevented. In addition, the impedance can be adjusted between the input side and the output side by adjusting the area size of the parts of the second lower electrode and the second upper electrode which face each other. By providing a rotation-symmetrical arrangement, the balancing performance can be improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15A is an isometric view showing a structure of a conventional balanced/unbalanced type coupled FBAR filter 900;

FIG. 16B is a cross-sectional view of the conventional balanced/unbalanced type coupled FBAR filter 800 shown in FIG. 16A taken along line F-F;

DESCRIPTION OF THE PREFERRED EMBODIMENTS

Hereinafter, embodiments of the present invention will be described with reference to the drawings.

First Embodiment

Figure 1A:
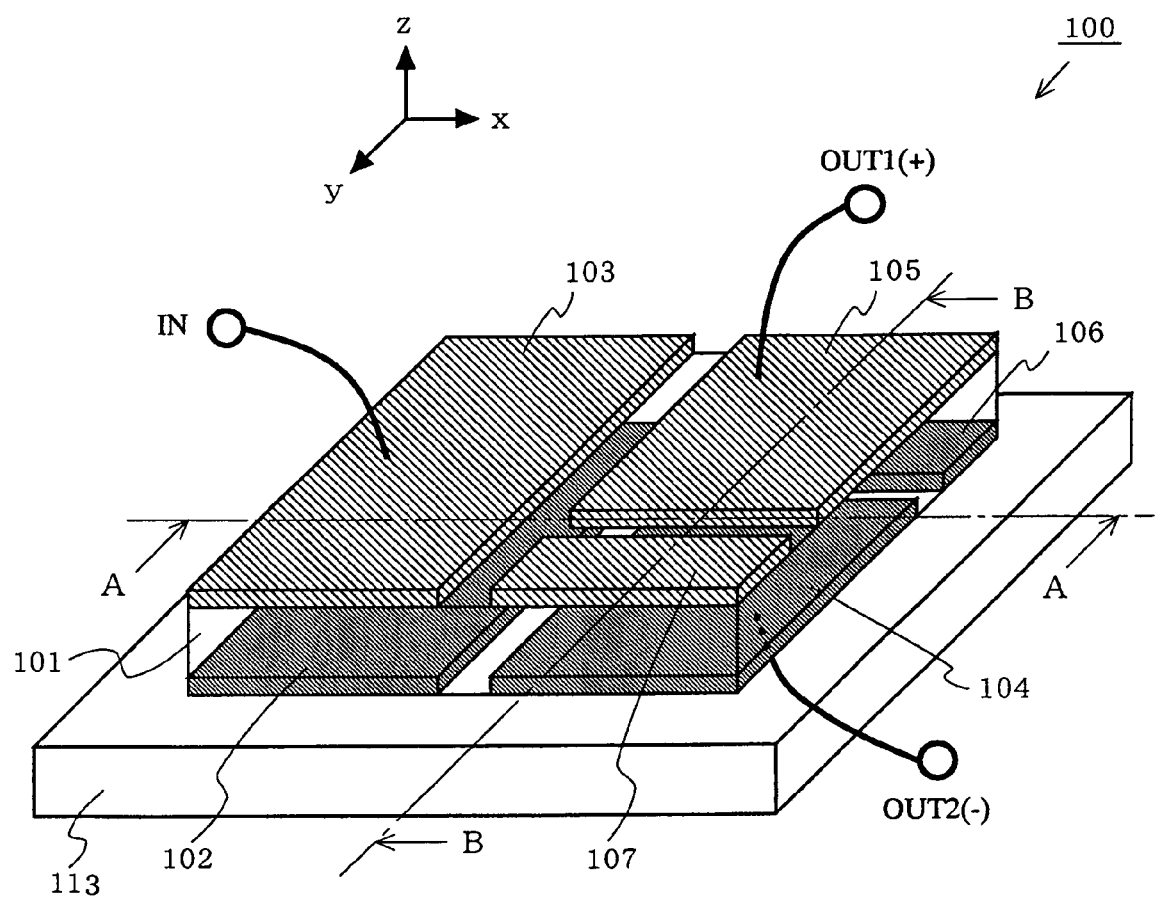
FIG. 1A is an isometric view showing a structure of a balanced/unbalanced type coupled FBAR filter 100 according to a first embodiment of the present invention.
Figure 1B:
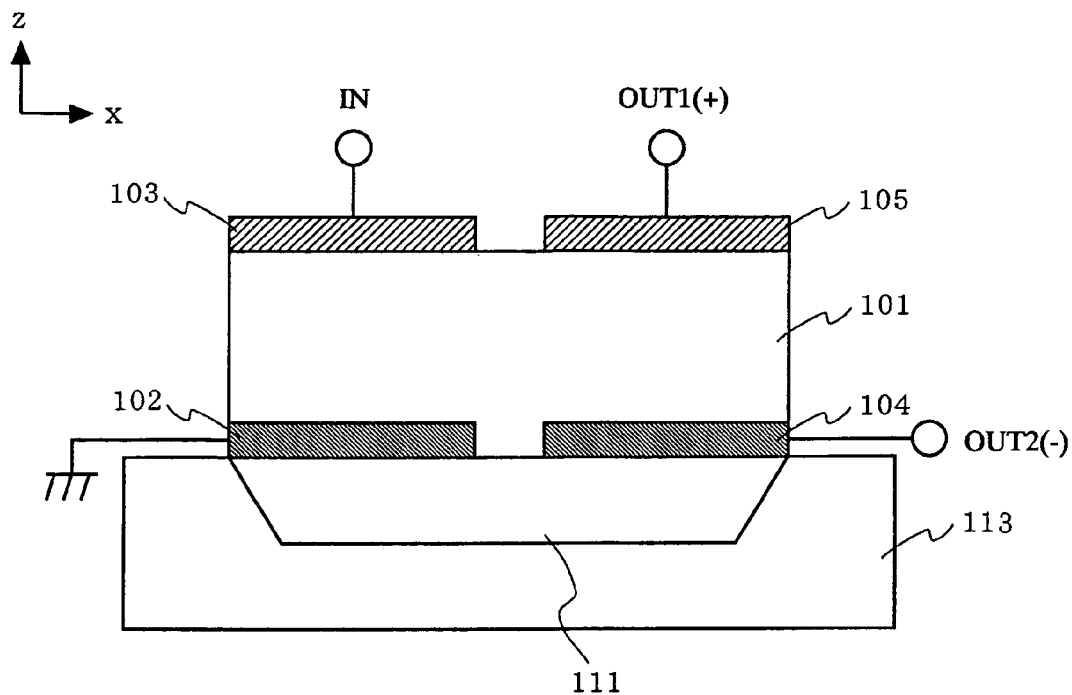
FIG. 1B is a cross-sectional view of the balanced/unbalanced type coupled FBAR filter 100 shown in FIG. 1A taken along line A-A.
Figure 1C:
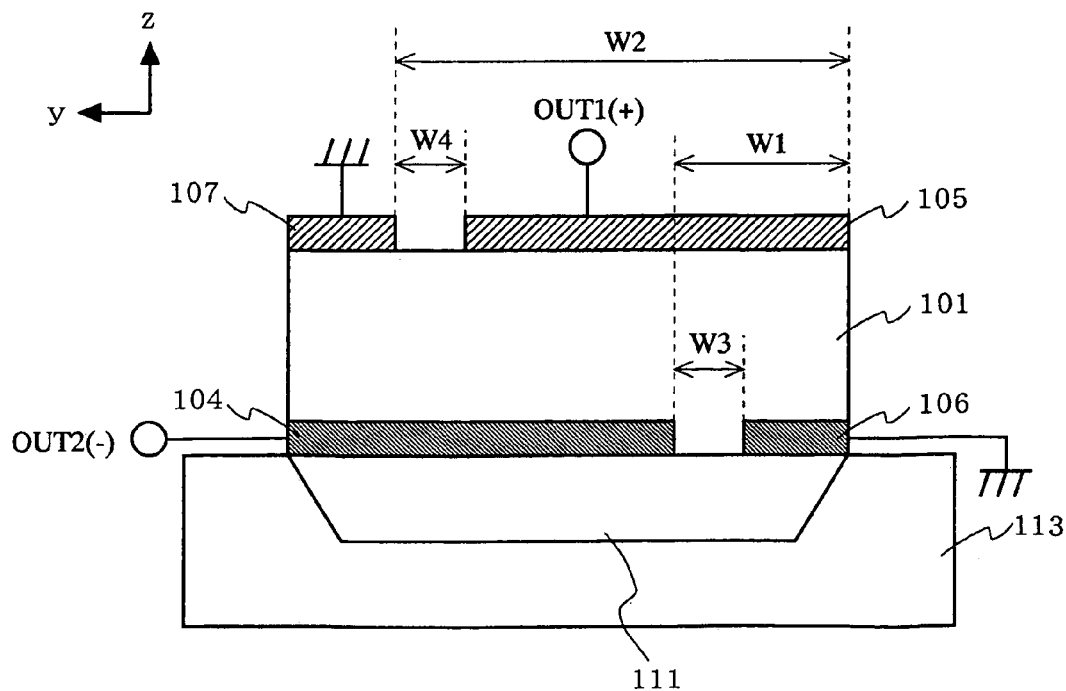
FIG. 1C is a cross-sectional view of the balanced/unbalanced type coupled FBAR filter 100 shown in FIG. 1A taken along line B-B.

FIG. 1 A is an isometric view showing a structure of a balanced/unbalanced type coupled FBAR filter 100 according to a first embodiment of the present invention. FIG. 1B is a cross-sectional view of the balanced/unbalanced type coupled FBAR filter 100 shown in FIG. 1 A taken along line A-A. FIG. 1C is a cross-sectional view of the balanced/unbalanced type coupled FBAR filter 100 shown in FIG. 1A taken along line B-B. As shown in FIG. 1A through FIG. 1C, the balanced/unbalanced type coupled FBAR filter 100 includes a substrate 113, a cavity 111, a piezoelectric thin film 101, a first lower electrode 102, a second lower electrode 104, a third lower electrode 106, a first upper electrode 103, a second upper electrode 105, and a third upper electrode 107. The directions represented by x, y and z axes in FIG. 1A through FIG. 1C correspond to the directions specified below. In FIG. 1A, the piezoelectric thin film 101 is shown as being transparent for easier understanding of the structure.

The first through third lower electrodes 102, 104 and 106, and the first through third upper electrodes 103, 105 and 107, are formed of, for example, molybdenum (Mo). The piezoelectric thin film 101 is formed of a piezoelectric material such as, for example, aluminum nitride (AlN).

First, the structure of the balanced/unbalanced type coupled FBAR filter 100 according to the first embodiment will be described in detail.

The first lower electrode 102, the first upper electrode 103, and a part of the piezoelectric thin film 101 interposed between these upper and lower electrodes form a first vibration section. The second and third upper electrodes 105 and 107, the second and third lower electrodes 104 and 106, and a part of the piezoelectric thin film 101 interposed between these upper and lower electrodes form a second vibration section. The first vibration section and the second vibration section are located parallel to each other on the substrate 113 while being separated from each other in the x direction. The substrate 113 has the cavity 111 for confining the vibration. The second lower electrode 104 and the third lower electrode 106 are separated from each other in the y direction by an insulating area, and the second upper electrode 105 and the third upper electrode 107 are separated from each other in the y direction by an insulating area.

The first lower electrode 102 and the first upper electrode 103 are formed to have generally the same length (x direction) and width (y direction), i.e., generally the same area size. The second lower electrode 104 and the second upper electrode 105 are formed to have generally the same length and width, i.e., generally the same area size. The third lower electrode 106 and the third upper electrode 107 are formed to have generally the same length and width, i.e., generally the same area size. The second lower electrode 104 and the third lower electrode 106 are located on the same plane while being separated from each other in the y direction by the insulating area having a width W3. The second upper electrode 105 and the third upper electrode 107 are located on the same plane while being separated from each other in the y direction by the insulating area having a width W4. The second lower electrode 104 and the second upper electrode 105 are offset in the y direction by a width W1. The third lower electrode 106 and the third upper electrode 107 are offset in the y direction by a width W2. A total area size of the second lower electrode 104, the third lower electrode 106 and the insulating area having the width W3 is generally equal to the area size of the first lower electrode 102. A total area size of the second upper electrode 105, the third upper electrode 107 and the insulating area having the width W4 is generally equal to the area size of the first upper electrode 103. In the case where the second and third lower and upper electrodes 104 through 107 are located so as to be rotation-symmetrical with respect to the central axis of the second vibration section extending in the x direction, the balancing performance is improved.

The structure of the balanced/unbalanced type coupled FBAR filter 100 has the following three features:

1. A part of the second lower electrode 104 and a part of the second upper electrode 105 face each other with the piezoelectric thin film 101 interposed therebetween (W2−W4>W1).
2. The entirety of the third upper electrode 107 faces a part of the second lower electrode 104 with the piezoelectric thin film 101 interposed therebetween (W2>W1).
3. The entirety of the third lower electrode 106 faces a part of the second upper electrode 105 with the piezoelectric thin film 101 interposed therebetween (W2−W4>W1−W3).

Owing to the above-described structure, either the first vibration section or the second vibration section which is on the input side excites a mechanical vibration from an input electric signal and propagates the mechanical vibration to the vibration section on the output side. The vibration section on the output side converts the excited mechanical vibration into an electric signal and outputs the electric signal. Namely, the impedance can be controlled. The cavity 111 commonly guarantees the vibrations of the first and second vibration sections and thus acts as a common vibration coupling section for coupling the vibrations.

Next, an operation of the balanced/unbalanced type coupled FBAR filter 100 according to the first embodiment will be described. In this example, the first upper electrode 103 is used as an input terminal IN and the first lower electrode 102 is used as a grounding terminal GND. The input terminal IN and the grounding terminal GND may be exchanged with each other. The third lower electrode 106 and the third upper electrode 107 are grounded.

First, an unbalanced signal (single phase signal) is input to the first upper electrode 103, and thus a voltage is applied between the first upper electrode 103 and the first lower electrode 102. Then, a vibration is excited to generate a plurality of modes resonating at a plurality of resonant frequencies in a transverse direction (x direction). At this point, it is preferable that the first vibration section couples a first-order mode and a second-order mode. Thus, a wide-band filter characteristic can be realized.

In general, in the second vibration on the output side, a vibration in a thickness direction (z direction) which is excited by the vibration in the transverse direction would be ideally at $\lambda/2$. Where the resonant frequency in the second vibration section is fr and the average sonic speed in the thickness direction is V, the wavelength $\lambda$ is represented by V/fr. Accordingly, in the case where the second vibration section is designed to have such a thickness as to obtain the resonant frequency fr, signals of opposite phases can be obtained from the second lower electrode 104 and the second upper electrode 105 of the second vibration section at the resonant frequency fr. Thus, signals which are output from the second lower electrode 104 and the second upper electrode 105 of the second vibration section are balanced signals (differential signals) having a balanced characteristic of a phase difference of 180 degrees and an amplitude difference of 0.

As shown in FIG. 1A through FIG. 1C, in the case where a single phase electric signal is input to the input terminal IN of the first upper electrode 103 and the first lower electrode 102 is grounded, differential electric signals are output from a terminal OUT1(+) connected to the second upper electrode 105 and a terminal OUT2(−) connected to the second lower electrode 104.

Figure 2:
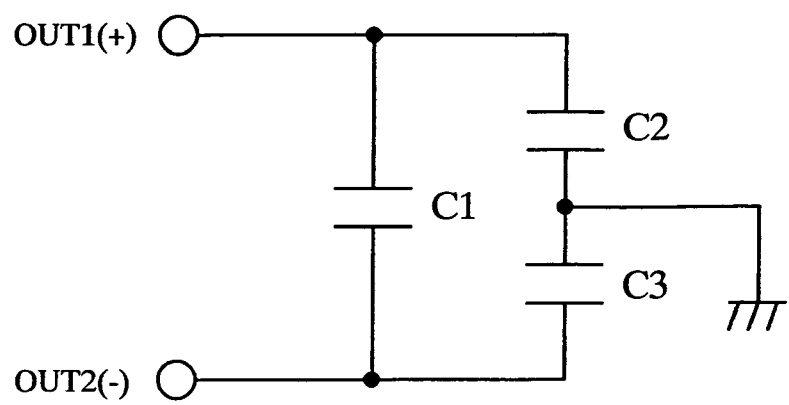
FIG. 2 is a simplified equivalent circuit diagram of a second vibration section.

FIG. 2 is a simplified equivalent circuit diagram of the second vibration section. In this figure, C1 is a damping capacitance formed by the second lower electrode 104 and the second upper electrode 105 facing each other, C2 is a damping capacitance formed by the second lower electrode 104 and the third upper electrode 107 facing each other, and C3 is a damping capacitance formed by the second upper electrode 105 and the third lower electrode 106 facing each other.

As shown in FIG. 2, the damping capacitance C1 is connected in series between the two output balanced terminals OUT1(+) (the second upper electrode 105) and OUT2(−) (the second lower electrode 104). A series circuit of the damping capacitances C2 and C3 is connected parallel to the damping capacitance C1. A connection point between the damping capacitances C2 and C3 is grounded.

At this point, a total capacitance Cout seen from the output balanced terminals OUT1(+) and OUT2(−) is obtained by $(C1 \cdot C2 + C2 \cdot C3 + C3 \cdot C1)/(C2+C3)$. The impedance seen from the output balanced terminals OUT1(+) and OUT2(−) is in inverse proportion to the total capacitance Cout. The damping capacitances C1 through C3 are each in proportion to the area size of the parts of the corresponding electrodes which face each other. In other words, the impedance can be adjusted by adjusting the ratio among three area sizes, i.e., an area size of the parts of the second lower electrode 104 and the second upper electrode 105 which face each other, an area size of the parts of the second lower electrode 104 and the third upper electrode 107 which face each other, and an area size of the parts of the second upper electrode 105 and the third lower electrode 106 which face each other.

Here, it is assumed that a damping capacitance between the first lower electrode 102 and the first upper electrode 103 is C0. In the case where neither the third lower electrode 106 nor the third upper electrode 107 exists and thus the second lower electrode 104 and the second upper electrode 105 entirely face each other, the total capacitance Cout of the second vibration section is equal to the damping capacitance C0. In the case where the second lower electrode 104 and the second upper electrode 105 do not face each other at all and thus the second lower electrode 104, the third upper electrode 107, the third lower electrode 106 and the second upper electrode 105 each have an area size which is half of that of the first vibration section, the total capacitance Cout is ¼×C0.

Therefore, the impedance can be adjusted in the range of Zin<Z<4 Zin, where Zin is the impedance of the vibration section on the input side which is calculated based on the damping capacitance C0 between the first lower electrode 102 and the first upper electrode 103 on the input side.

Figure 3:
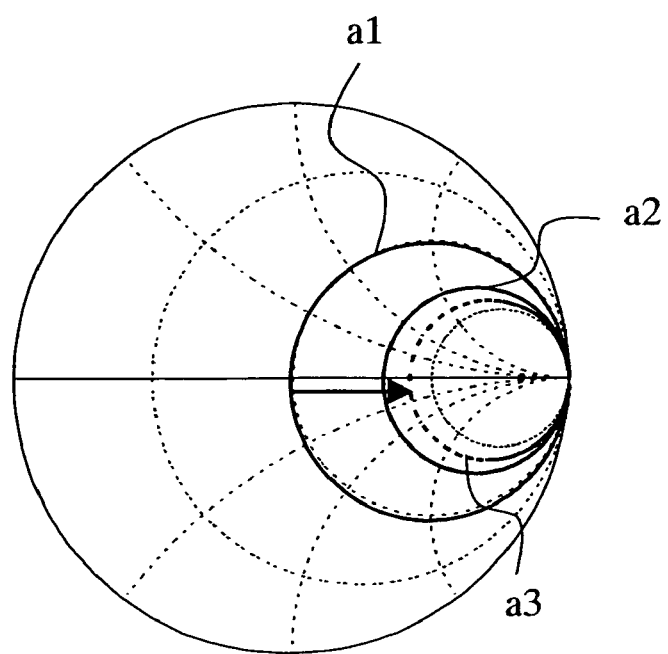
FIG. 3 is a Smith chart illustrating an exemplary change in the impedance when the area size ratio between an upper electrode and a lower electrode in the second vibration section is changed.

FIG. 3 is a Smith chart illustrating an exemplary change in the impedance when the area size ratio between the upper electrode and the lower electrode in the vibration section on the output side is changed. In FIG. 3, a1 is the impedance when neither the third lower electrode 106 nor the third upper electrode 107 exists and thus the second lower electrode 104 and the second upper electrode 105 entirely face each other. a2 is the impedance when ⅓ of the second lower electrode 104 in the length direction and ⅓ of the second upper electrode 105 in the length direction face each other. a3 is the impedance when ⅕ of the second lower electrode 104 in the length direction and ⅕ of the second upper electrode 105 in the length direction face each other. As shown in FIG. 3, as the area size of the parts of the second lower electrode 104 and the second upper electrode 105 which face each other decreases, a higher impedance can be obtained. In this manner, the impedance on the input side and the impedance on the output side can be significantly varied.

As described above, the balanced/unbalanced type coupled FBAR filter 100 according to the first embodiment of the present invention makes the total area size of the electrodes forming the first vibration section generally equal to the total area size of the electrodes forming the second vibration section. Owing to this, the loss of the vibration propagated between the vibration sections is prevented, and thus the charge generated in the vibration section on the input side can be efficiently used in the vibration section on the output side. As a result, the resonant frequency band can be widened.

Since the first vibration section and the second vibration section have generally the same shape and are located to face each other, generation of an unnecessary mode is prevented. In addition, the impedance can be easily controlled by adjusting the area size of the parts of the second lower electrode 104 and the second upper electrode 105 which face each other.

In a structure in which balanced signals (differential signals) are input to the second vibration section and an unbalanced signal (single phase signal) is output from the first vibration section, substantially the same effects are provided.

Figure 4A:
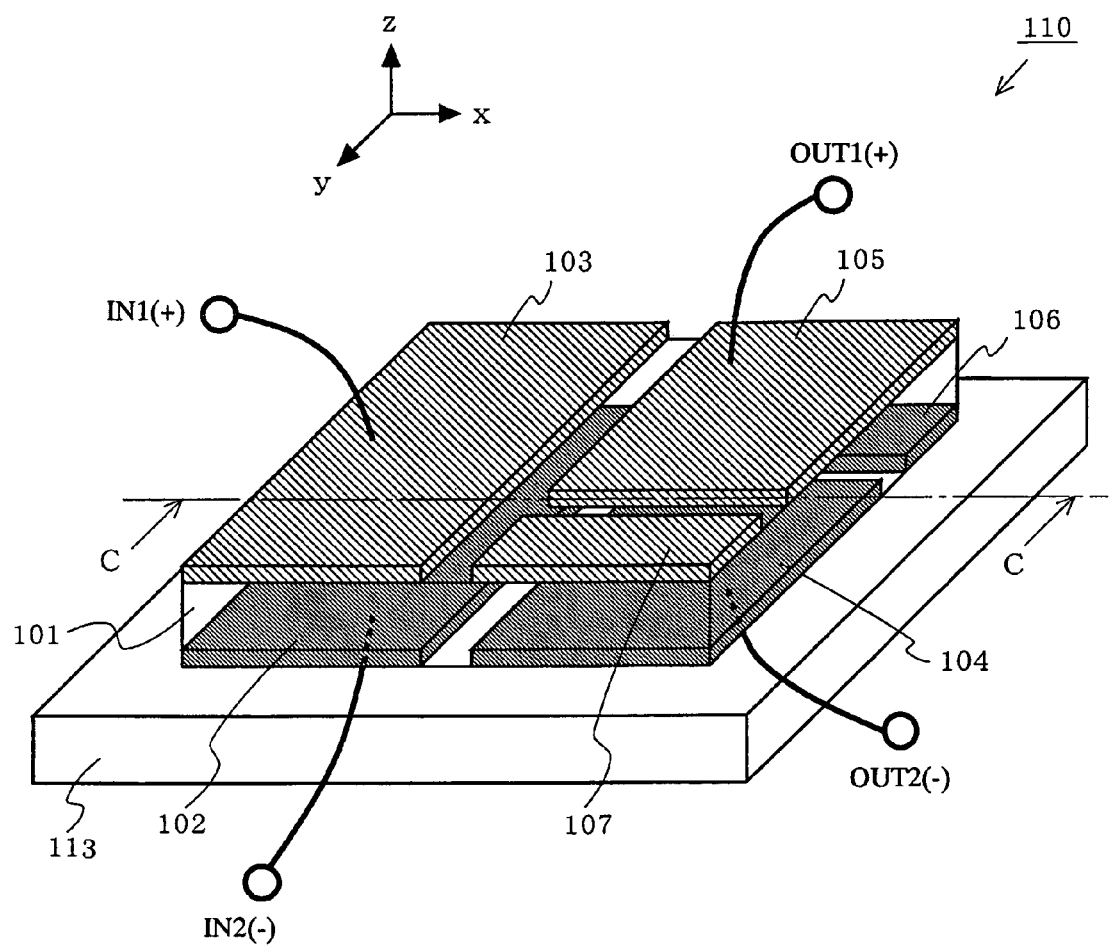
FIG. 4A is an isometric view showing a structure of a balanced/balanced type coupled FBAR filter 110 according to the first embodiment.
Figure 4B:
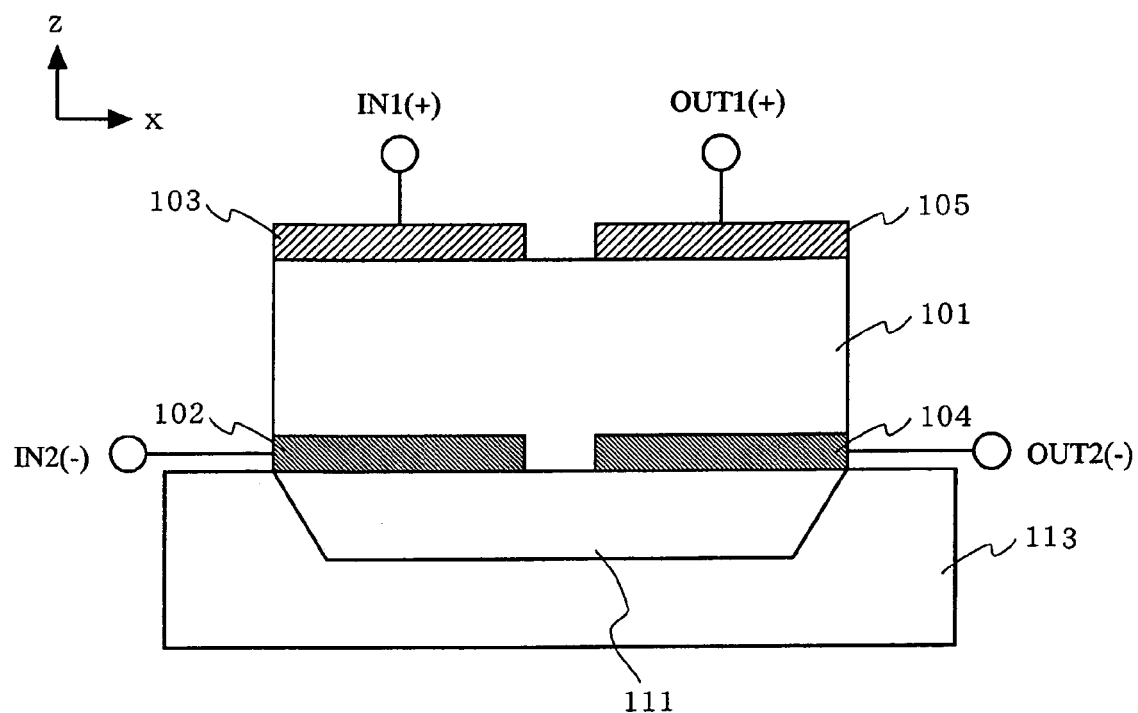
FIG. 4B is a cross-sectional view of the balanced/balanced type coupled FBAR filter 110 shown in FIG. 4A taken along line C-C.

In the first embodiment, the balanced/unbalanced type coupled FBAR filter 100 having one input terminal and two output terminals is described. As shown in FIG. 4A and FIG. 4B, a balanced/balanced type coupled FBAR filter 110 may be provided by adding one more input terminal to the above-described structure.

Figure 5A:
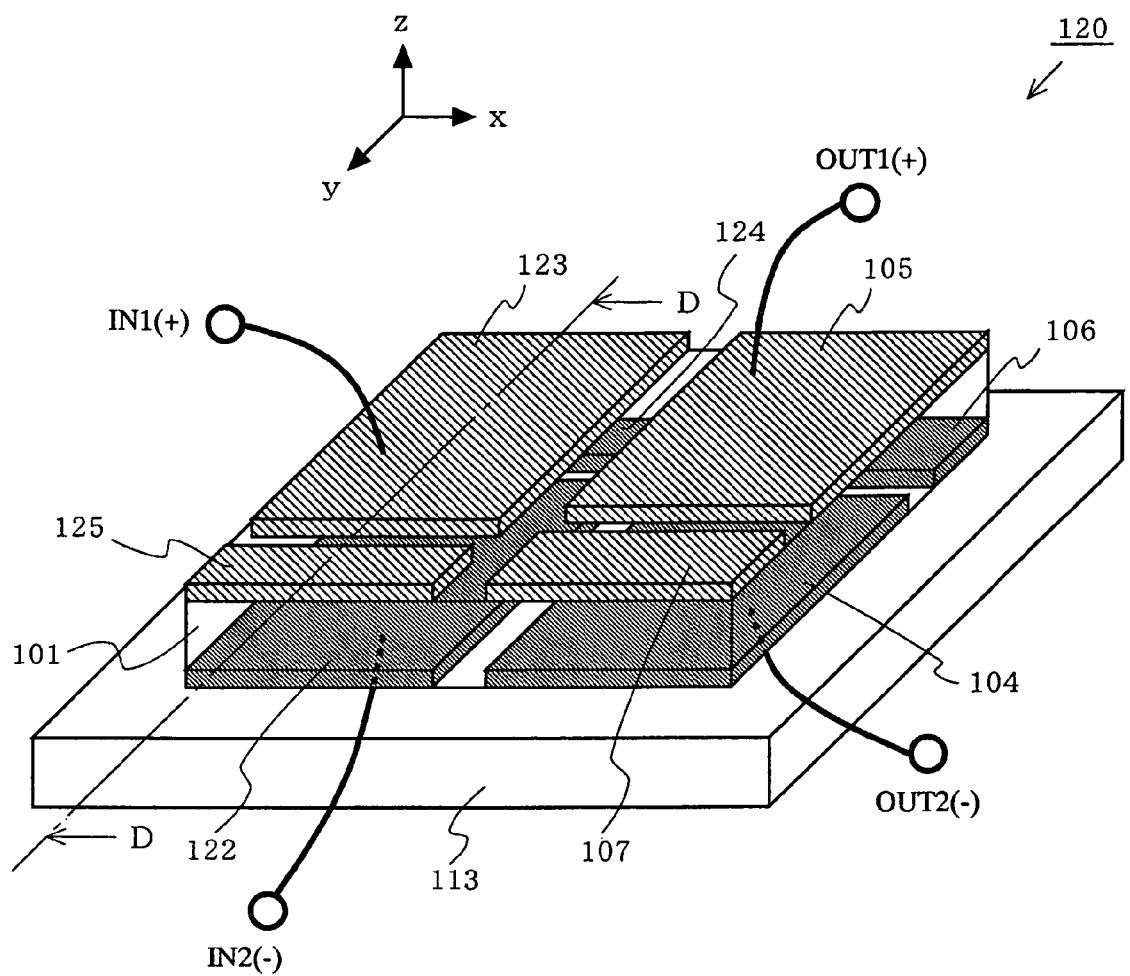
FIG. 5A is an isometric view showing a structure of another balanced/balanced type coupled FBAR filter 120 according to the first embodiment.
Figure 5B:
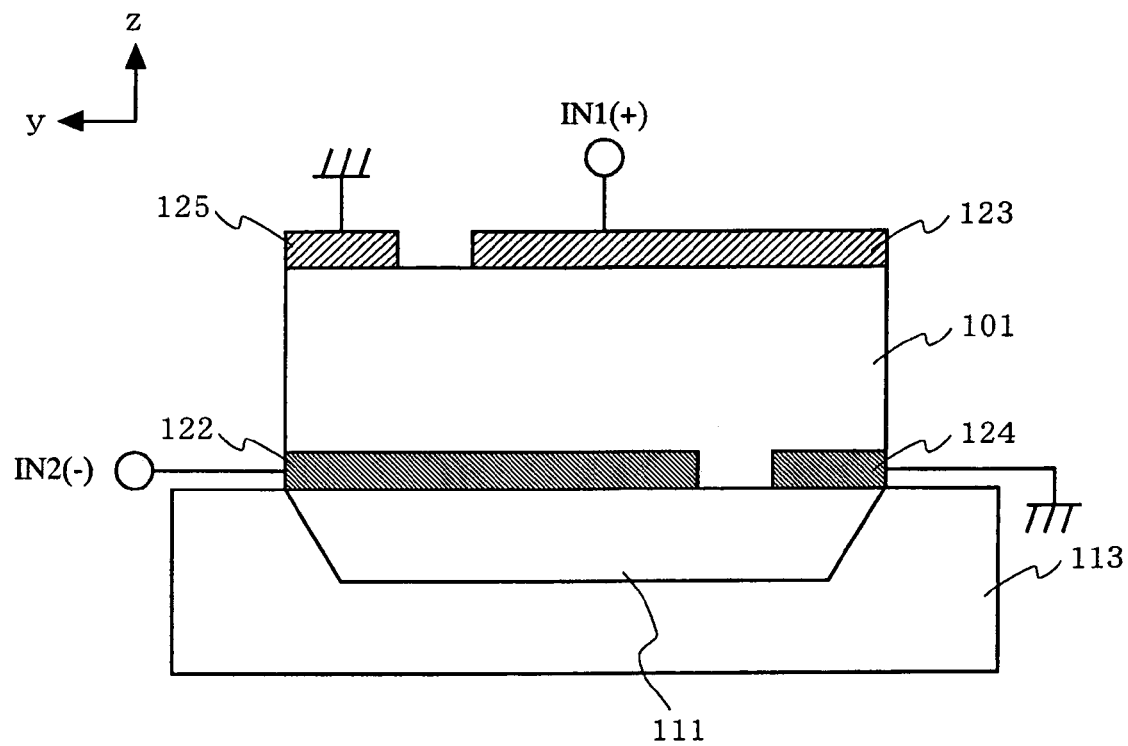
FIG. 5B is a cross-sectional view of the balanced/balanced type coupled FBAR filter 120 shown in FIG. 5A taken along line D-D.

The electrodes in the first vibration section of the balanced/balanced type coupled FBAR filter 110 may be divided to obtain a balanced/balanced type coupled FBAR filter 120 shown in FIG. 5A and FIG. 5B. In this case, the impedance on the input side can further be converted.

Figure 6A:
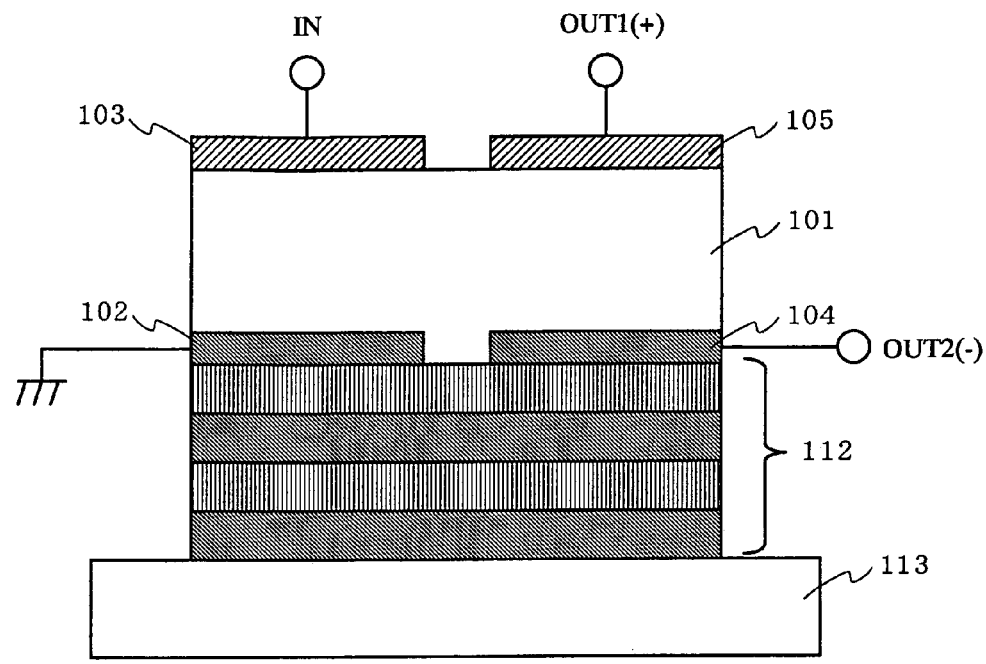
FIG. 6A is a cross-sectional view of the balanced/unbalanced type coupled FBAR filter 100 shown in FIG. 1A taken along A-A in the case where an acoustic mirror layer 112 is used.
Figure 6B:
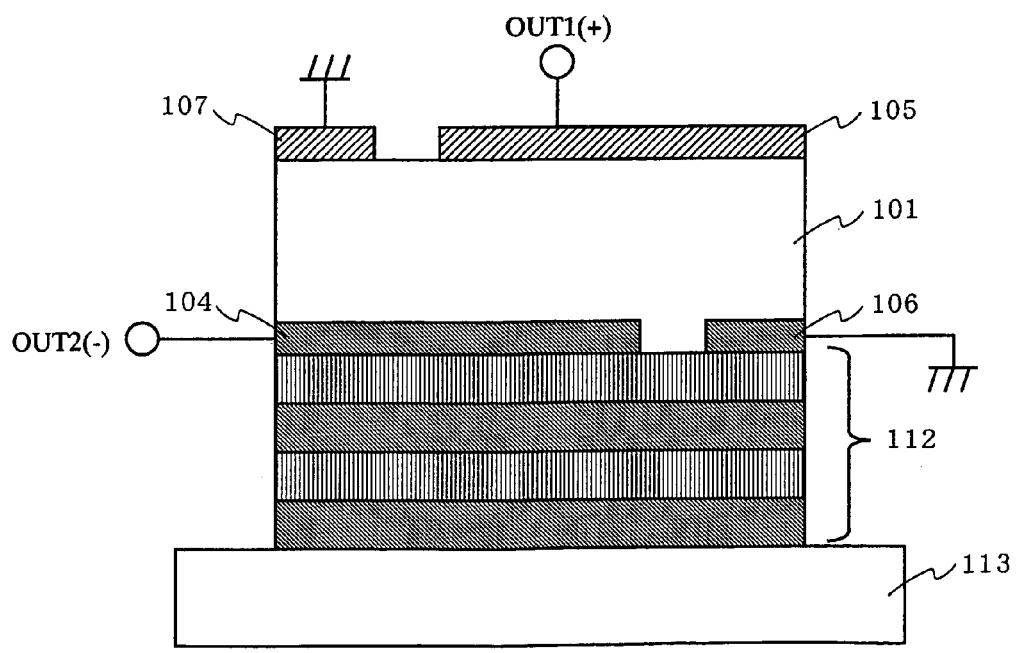
FIG. 6B is a cross-sectional view of the balanced/unbalanced type coupled FBAR filter 100 shown in FIG. 1A taken along B-B in the case where the acoustic mirror layer 112 is used.

As shown in FIG. 6A and FIG. 6B, in the balanced/unbalanced type coupled FBAR filter 100 according to the first embodiment, the cavity 111 may be replaced with an acoustic mirror layer 112 including low acoustic impedance layers and high acoustic impedance layers located alternately. Substantially the same effects are provided.

Second Embodiment

Figure 7A:
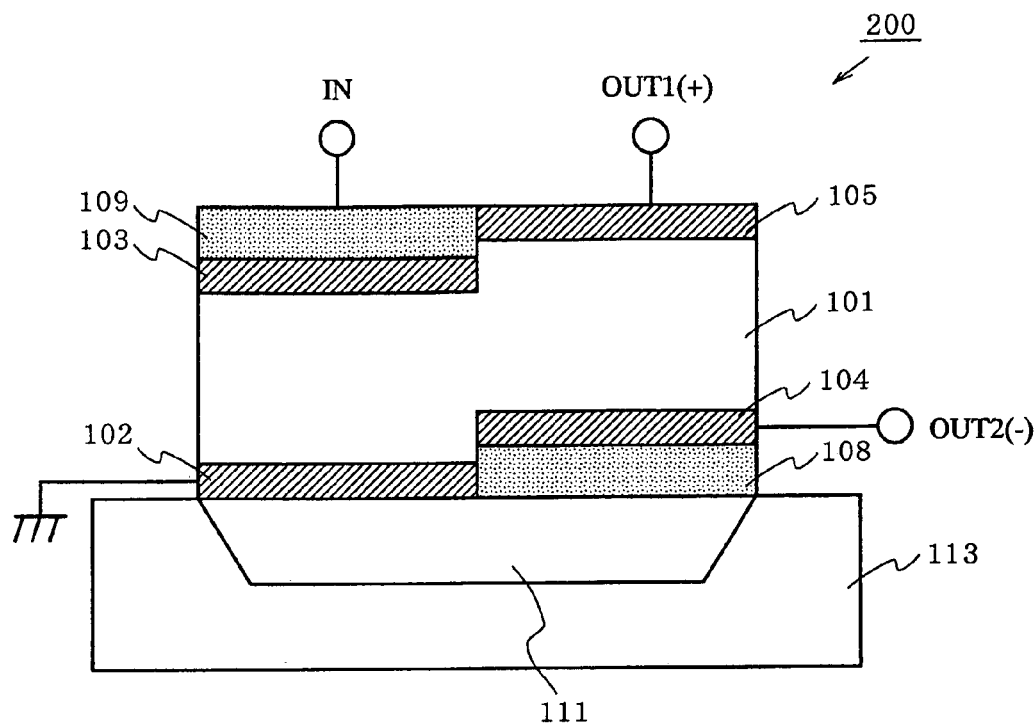
FIG. 7A is a cross-sectional view showing a structure of a balanced/unbalanced type coupled FBAR filter 200 according to a second embodiment of the present invention.

FIG. 7A is a cross-sectional view showing a structure of a balanced/unbalanced type coupled FBAR filter 200 according to a second embodiment of the present invention. The cross-sectional view shown in FIG. 7A corresponds to the cross-sectional view shown in FIG. 1B taken along line A-A.

The balanced/unbalanced type coupled FBAR filter 200 has the following features in addition to those of the balanced/unbalanced type coupled FBAR filter 100 according to the first embodiment.

1. The first vibration section and the second vibration section are located adjacently in contact with each other with no gap therebetween.
2. The first lower electrode 102 is electrically insulated from the second and third lower electrodes 104 and 106.
3. The first upper electrode 103 is electrically insulated from the second and third upper electrodes 105 and 107.
4. The resonant frequency of the first vibration section in the thickness direction (z direction) is generally equal to the resonant frequency of the second vibration section in the thickness direction (z direction).

A condition for realizing the features 1 through 3 is to provide a second insulator 108 having a greater thickness than that of the first lower electrode 102 below the second and third lower electrodes 104 and 106. In a general production process, the amount of the piezoelectric thin film 101 stacked is managed by time. Therefore, the piezoelectric thin film 101 stacked on the first lower electrode 102 and the piezoelectric thin film 101 stacked on the second and third lower electrodes 104 and 106 have an equal thickness. As a result, the difference in level between a top surface of the second and third lower electrodes 104 and 106 and a top surface of the first lower electrode 102 usually appears as a surface step of the piezoelectric thin film 101. Another condition for realizing the features 1 through 3 is to make the thickness of the first upper electrode 103 smaller than the height of the surface step of the piezoelectric thin film 101. For realizing the feature 4, for example, a first insulator 109 is stacked on the first vibration section (on the first upper electrode 103) to a level matching the level of the second and third upper electrodes 105 and 107.

As described above, the balanced/unbalanced type coupled FBAR filter 200 according to the second embodiment of the present invention can prevent the generated charge from being consumed in a non-electrode portion, unlike the structure of the first embodiment. Owing to this, the vibration modes of the two vibration sections can be efficiently coupled. Therefore, the generated charge can be efficiently used, and smaller-loss and wider-band characteristics can be realized.

Figure 7B:
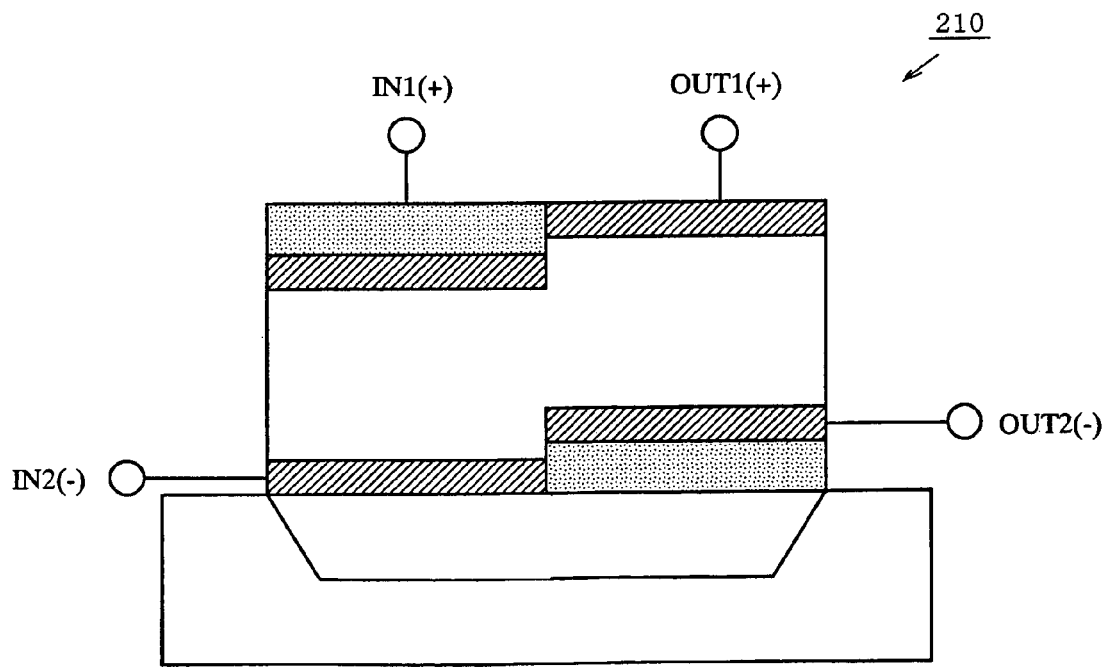
FIG. 7B is a cross-sectional view showing a structure of a balanced/balanced type coupled FBAR filter 210 according to the second embodiment of the present invention.

As shown in FIG. 7B, a balanced/balanced type coupled FBAR filter 210 may be provided by adding one more input terminal to the balanced/unbalanced type coupled FBAR filter 200 according to the second embodiment.

Third Embodiment

Figure 8A:
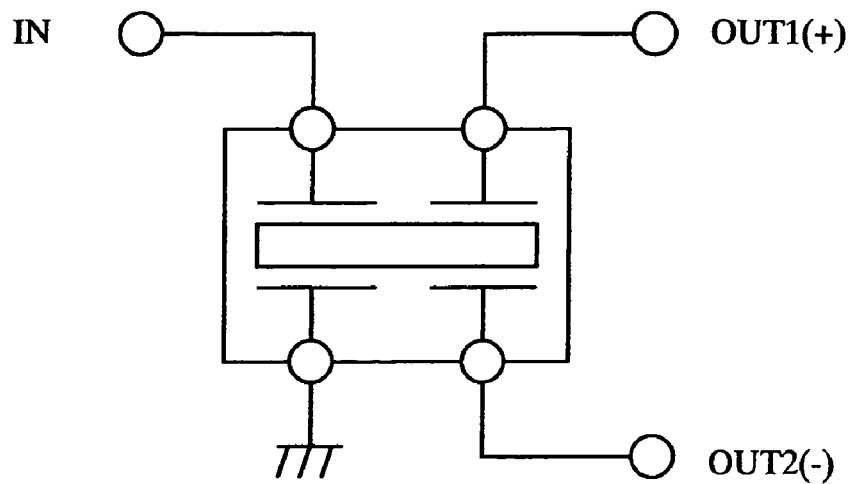
FIG. 8A shows a circuit formation representing a balanced/unbalanced type coupled FBAR filter according to the present invention.
Figure 8B:
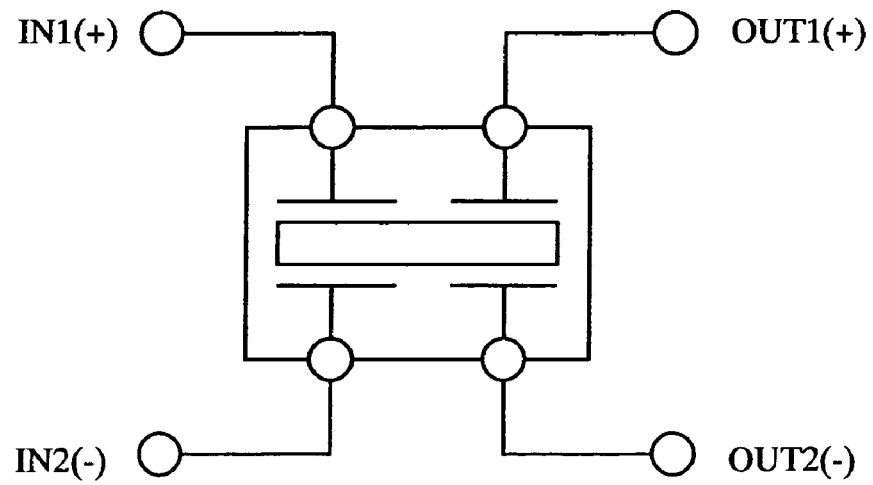
FIG. 8B shows a circuit formation representing a balanced/balanced type coupled FBAR filter according to the present invention.

In a third embodiment, exemplary applications of a coupled FBAR filter according to the present invention will be described. FIG. 8A shows a circuit formation of a balanced/unbalanced type coupled FBAR filter according to the present invention. FIG. 8B shows a circuit formation of a balanced/balanced type coupled FBAR filter according to the present invention. Hereinafter, a coupled FBAR filter according to the present invention will be represented with the circuit formation shown in FIG. 8A or FIG. 8B.

Figure 9A:
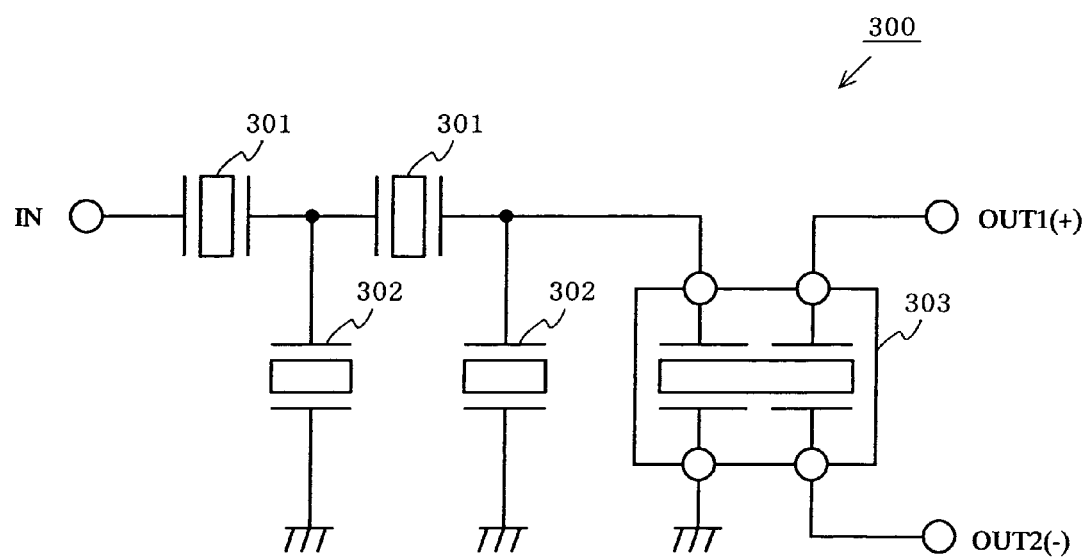
FIG. 9A is a circuit diagram of a ladder-type filter 300 using a balanced/unbalanced type coupled FBAR filter according to the present invention.

FIG. 9A is a circuit diagram of a ladder-type filter 300 including a balanced/unbalanced type coupled FBAR filter according to the present invention. As shown in FIG. 9A, the ladder-type filter 300 includes a plurality of FBAR filters 301 connected in series, a plurality of FBAR filters 302 connected in parallel to the plurality of FBAR filters 301, and a balanced/unbalanced type coupled FBAR filter 303 according to the present invention connected to an output. The FBAR filters 301 and 302 are not limited to being provided in the number shown in FIG. 9A as long as being connected in a ladder manner. The balanced/unbalanced type coupled FBAR filter 303 according to the present invention is not limited to being connected at the position shown in FIG. 9A.

Figure 9B:
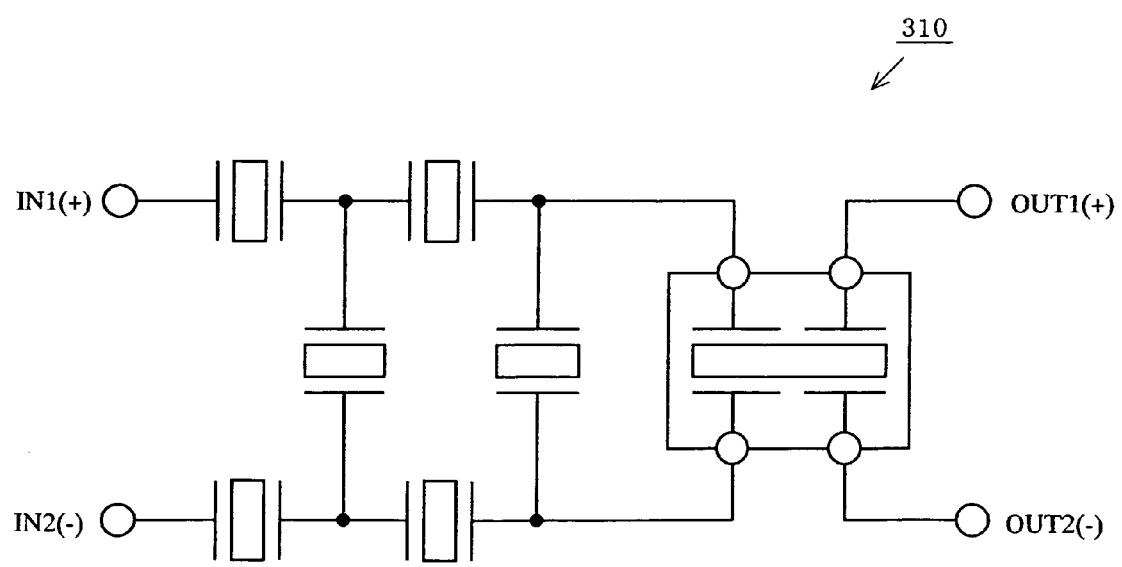
FIG. 9B is a circuit diagram of a ladder-type filter 310 using a balanced/balanced type coupled FBAR filter according to the present invention.

FIG. 9B shows a circuit diagram of a ladder-type filter 310 including a balanced/balanced type coupled FBAR filter.

In this manner, by connecting a balanced/unbalanced type coupled FBAR filter according to the present invention to a ladder-type filter including FBAR filters, a filter having smaller-loss and wider-band characteristics and capable of matching the impedances and performing balanced/unbalanced conversion can be realized.

Figure 10:
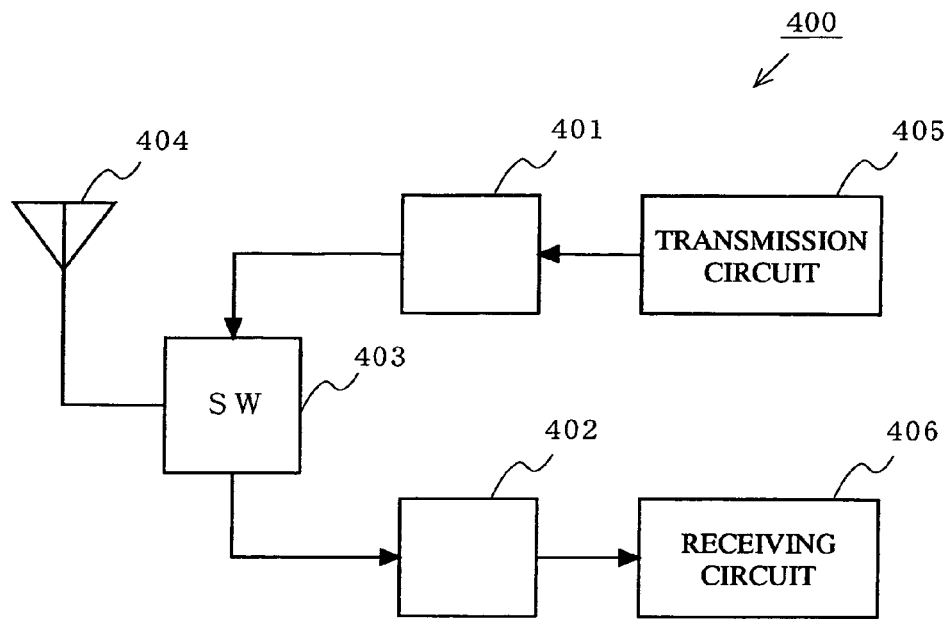
FIG. 10 is a block diagram showing a structure of a communication device 400 using a balanced/unbalanced type coupled FBAR filter according to the present invention.

FIG. 10 is a block diagram showing a structure of a communication device 400 using a coupled FBAR filter according to the present invention. As shown in FIG. 10, the communication device 400 includes a transmission circuit 405, a receiving circuit 406, balanced/unbalanced type coupled FBAR filters 401 and 402 according to the present invention, a switching circuit 403, and an antenna 404.

The balanced/unbalanced type coupled FBAR filter 401 is connected between the transmission circuit 405 and the switching circuit 403, and has a characteristic of passing through a transmission frequency band. The sizes of the electrodes therein are adjusted to match the impedance between the circuits. The balanced/unbalanced type coupled FBAR filter 401 converts a balanced signal from the transmission circuit 405 into an unbalanced signal and inputs the unbalanced signal to the switching circuit 403. The balanced/unbalanced type coupled FBAR filter 402 is connected between the receiving circuit 406 and the switching circuit 403, and has a characteristic of passing through a receiving frequency band. The sizes of the electrodes therein are adjusted to match the impedance between the circuits. The balanced/unbalanced type coupled FBAR filter 402 converts an unbalanced signal from the switching circuit 403 into a balanced signal and inputs the balanced signal to the receiving circuit 406. The switching circuit 403 is switched either to propagate a signal from the transmission circuit 405 toward the antenna 404 or to propagate a signal from the antenna 404 toward the receiving circuit 406.

In this manner, by using a balanced/unbalanced type coupled FBAR filter according to the present invention for a communication device, a communication device having smaller-loss and wider-band characteristics can be realized.

Figure 11:
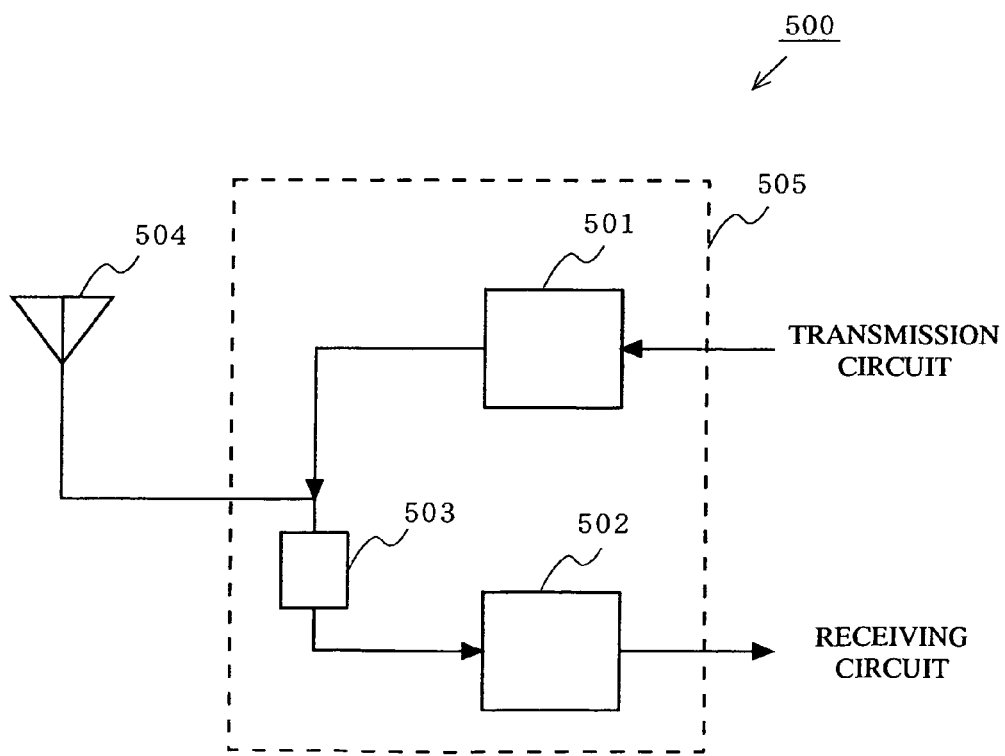
FIG. 11 is a block diagram showing a structure of a duplexer 500 using a balanced/unbalanced type coupled FBAR filter according to the present invention.
Figure 12:
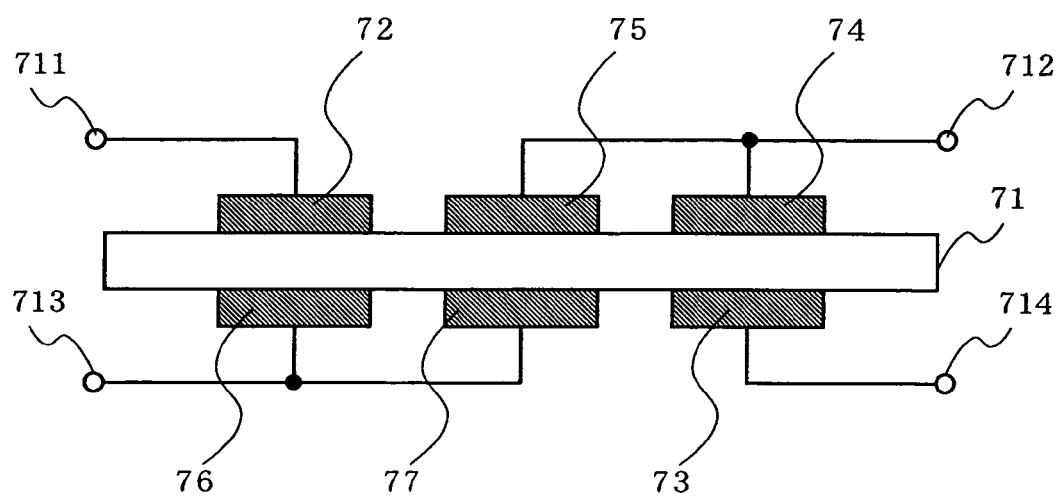
FIG. 12 shows a conventional balanced type MCF.
Figure 13:
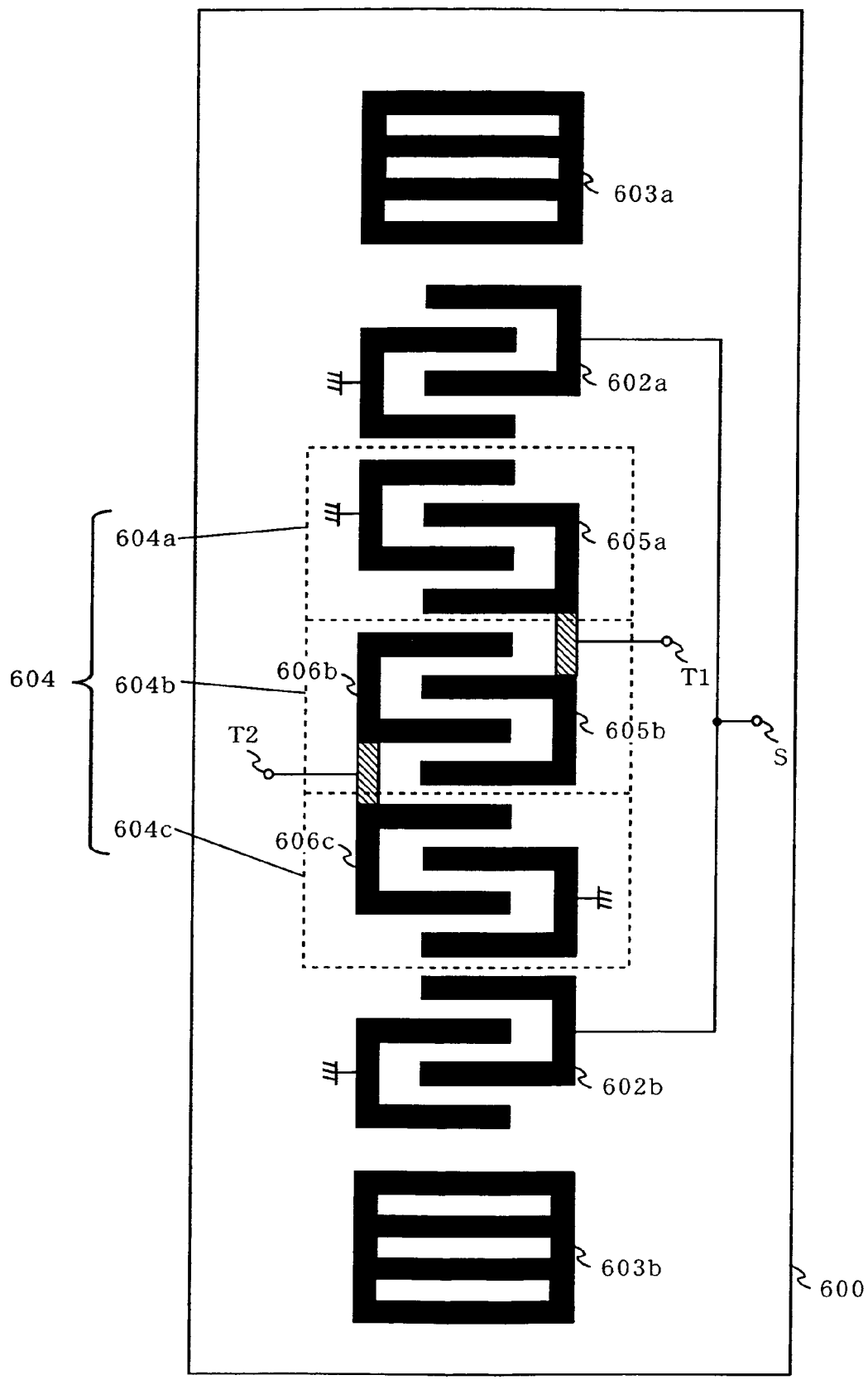
FIG. 13 shows a structure for controlling the impedance at balanced terminals of a conventional balanced type SAW filter 600.
Figure 14:
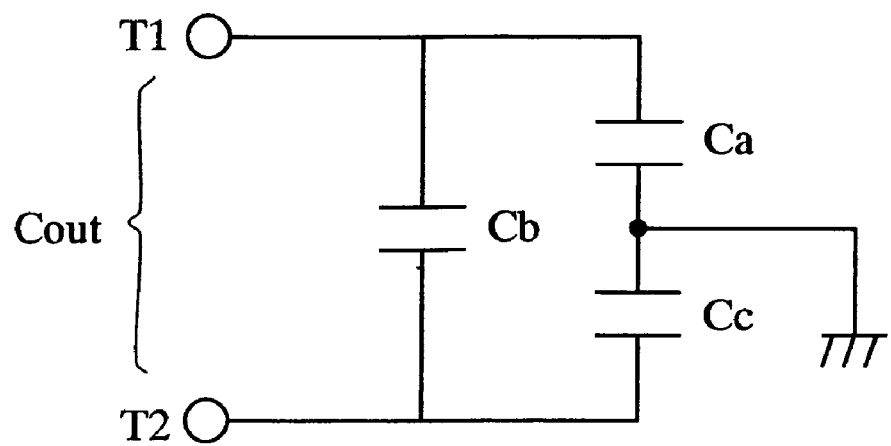
FIG. 14 is a capacitance equivalent circuit diagram between output balanced terminals of the balanced type SAW filter shown in FIG. 13.
Figure 15B:
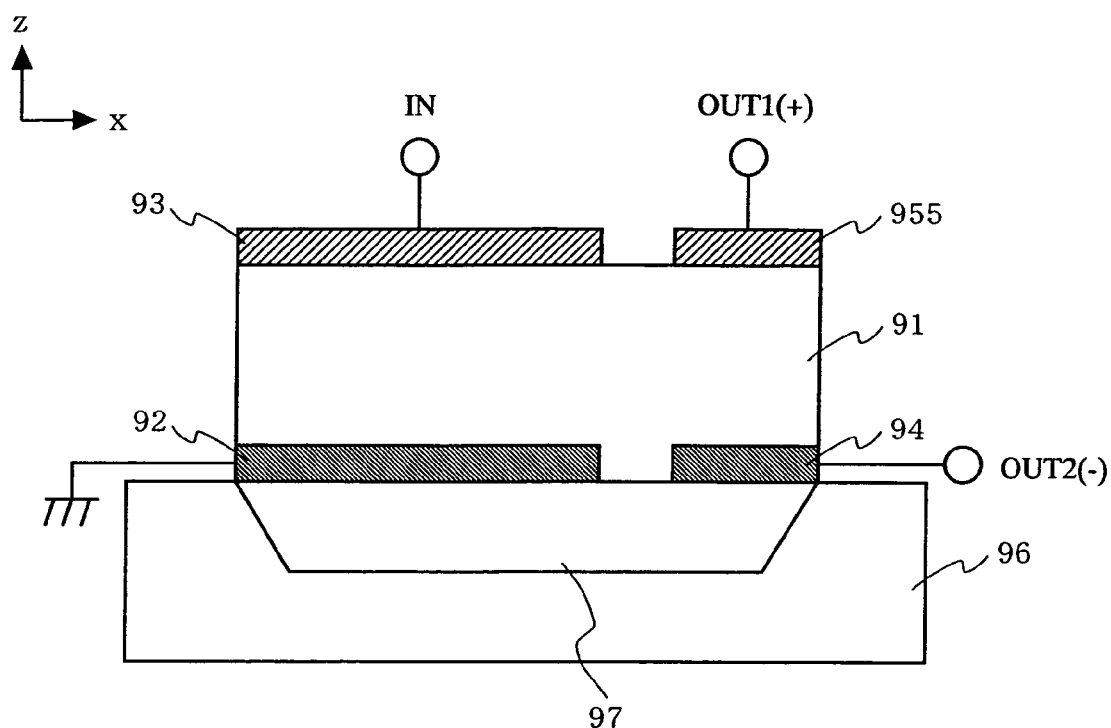
FIG. 15B is a cross-sectional view of the conventional balanced/unbalanced type coupled FBAR filter 900 shown in FIG. 15A taken along line E-E.
Figure 16A:
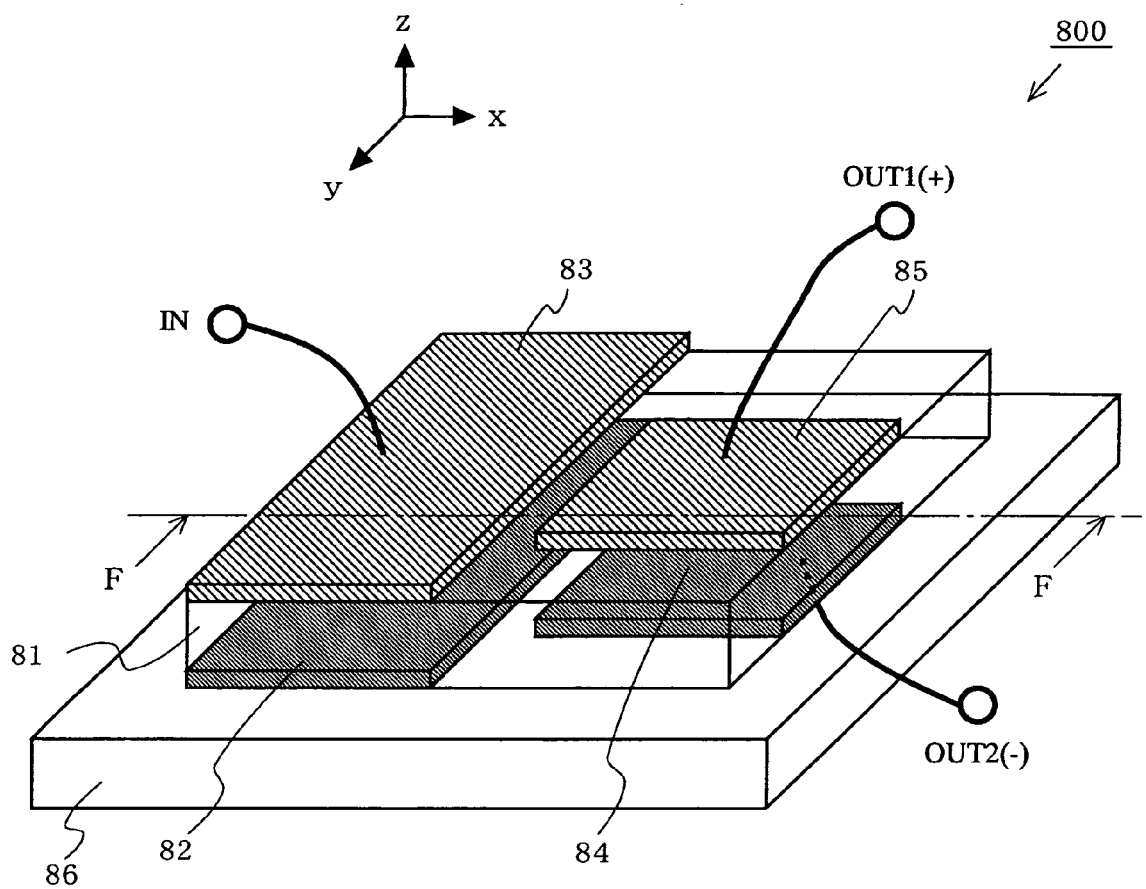
FIG. 16A is an isometric view showing a structure of a conventional balanced/unbalanced type coupled FBAR filter 800.
Figure 17:
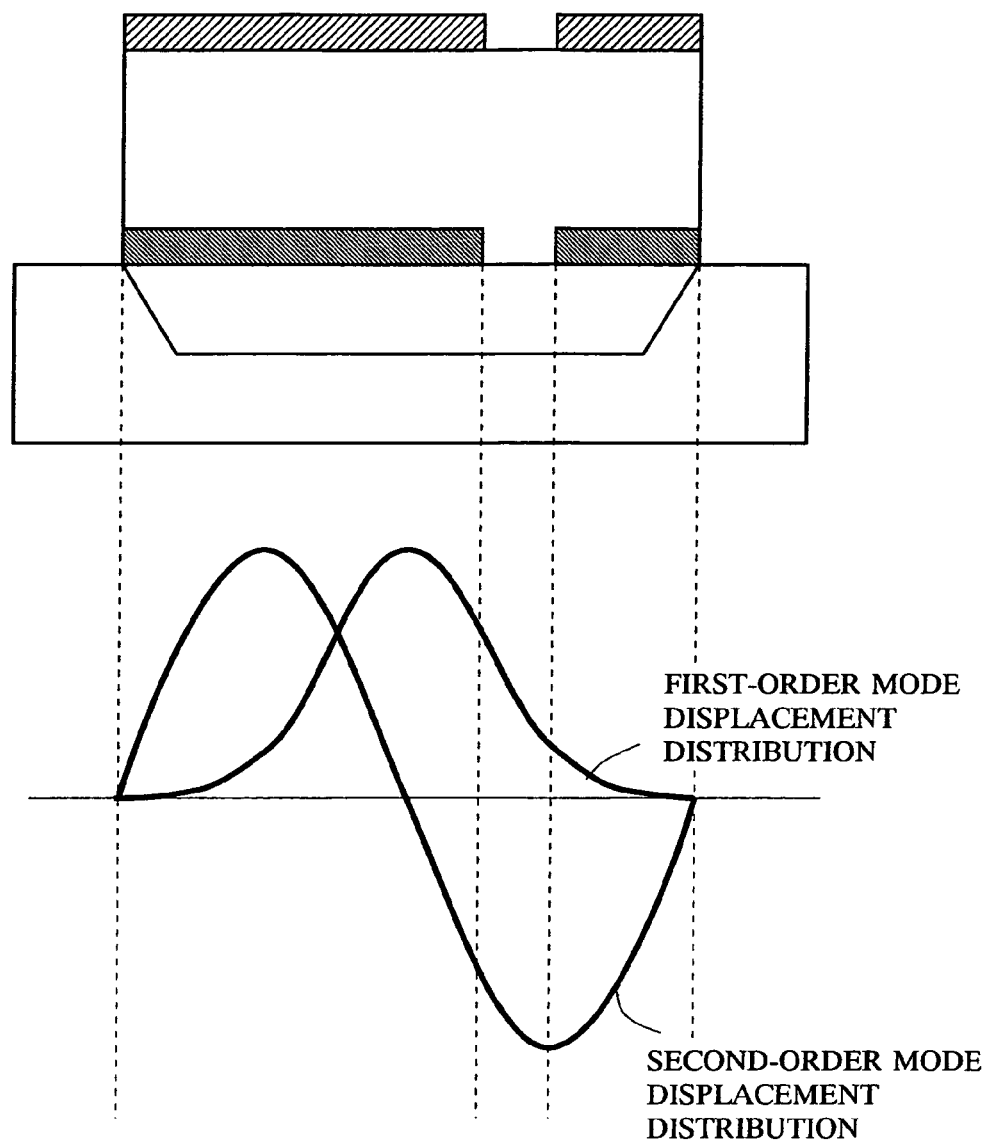
FIG. 17 shows ideal vibration mode distributions in the conventional balanced/unbalanced type coupled FBAR filter shown in FIG. 15A and FIG. 15B.
Figure 18:
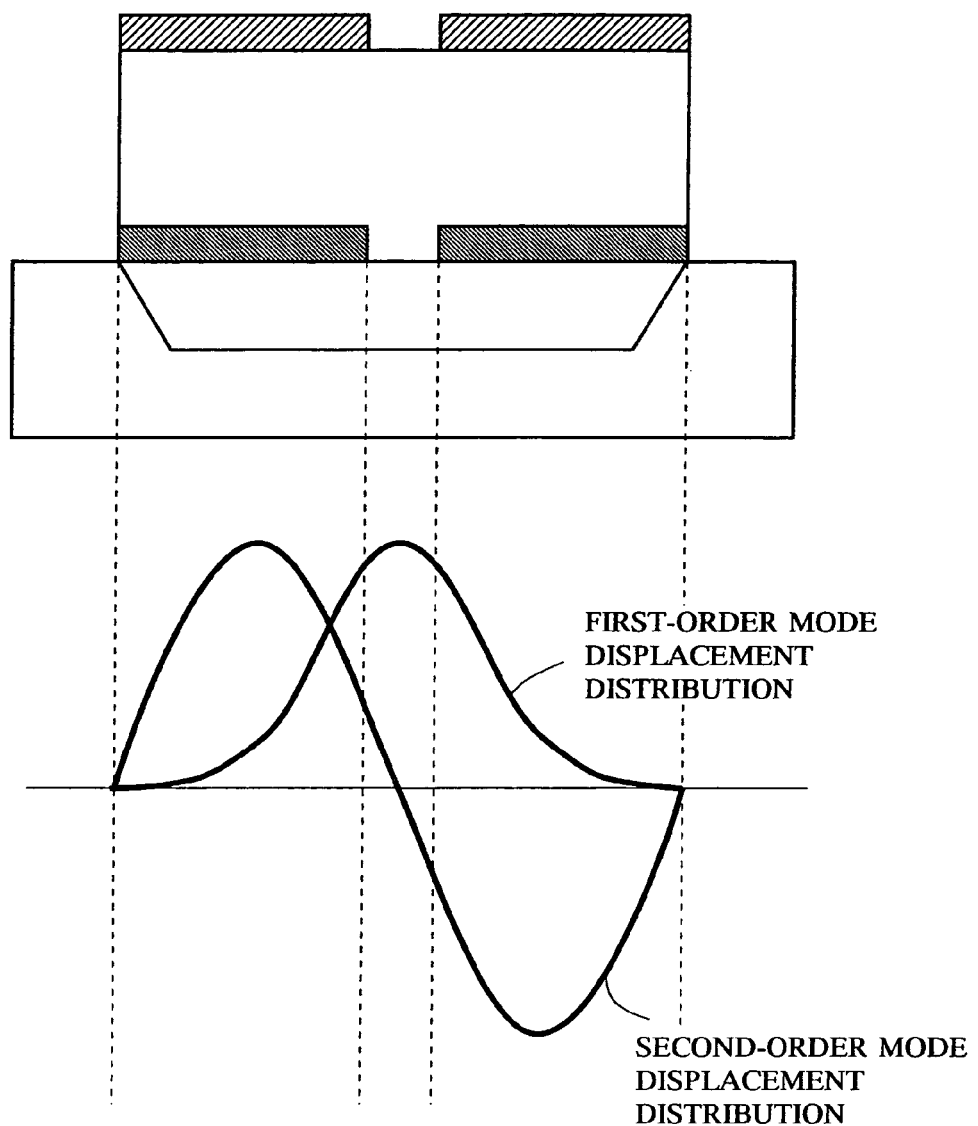
FIG. 18 shows ideal vibration mode distributions in the conventional balanced/unbalanced type coupled FBAR filter shown in FIG. 16A and FIG. 16B.

FIG. 11 is a block diagram showing a structure of a duplexer 500 using a balanced/unbalanced type coupled FBAR filter according to the present invention. As shown in FIG. 11, the duplexer 500 includes a balanced/unbalanced type coupled FBAR filter 501 according to the present invention connected on the side of a transmission circuit, a balanced/unbalanced type coupled FBAR filter 502 according to the present invention connected on the side of a receiving circuit, and an isolation phase shifter 503.

Owing to the structure shown in FIG. 11, the balanced/unbalanced type coupled FBAR filter 501 allows only a signal of a transmission frequency band to pass therethrough, matches the impedance between the antenna 504 and the transmission circuit, and converts a balanced signal from the transmission circuit into an unbalanced signal and outputs the unbalanced signal from the antenna 504. The balanced/unbalanced type coupled FBAR filter 502 allows only a signal of a receiving frequency band to pass therethrough, matches the impedance between the isolation phase shifter 503 and the receiving circuit, and converts an unbalanced signal from the isolation phase shifter 503 into a balanced signal and inputs the balanced signal to the receiving circuit. Thus, a duplexer which has a smaller loss and is usable over a wider band can be realized.

A balanced/unbalanced type coupled FBAR filter according to the present invention is applicable to any device requiring a filter characteristic or a balanced/unbalanced conversion characteristic.

While the invention has been described in detail, the foregoing description is in all aspects illustrative and not restrictive. It is understood that numerous other modifications and variations can be devised without departing from the scope of the invention.

What is claimed is:

1. A balanced/unbalanced type coupled FBAR filter for performing conversion between a balanced signal and an unbalanced signal using FBARs, the balanced/unbalanced type coupled FBAR filter comprising:
   a first vibration section including an FBAR;
   a second vibration section including an FBAR and located parallel to the first vibration section; and
   a common vibration guaranteeing section, having the first and second vibration sections provided thereon, for commonly guaranteeing a vibration of the first vibration section and a vibration of the second vibration section so as to couple the two vibrations;
   wherein:
   the first vibration section includes:
      a first lower electrode;
      a first upper electrode located to face the first lower electrode; and
      a part of a piezoelectric thin film interposed between the first lower electrode and the first upper electrode;
      wherein either the first lower electrode or the first upper electrode is used as an input/output terminal;
   the second vibration section includes:
      a second lower electrode;
      a third lower electrode separated from the second lower electrode by an insulating area;
      a second upper electrode located to face a part of the third lower electrode;
      a third upper electrode located to face a part of the second lower electrode and separated from the second upper electrode by an insulating area; and
      another part of the piezoelectric thin film interposed between the second and third lower electrodes and the second and third upper electrodes;
      wherein the second lower electrode and the second upper electrode are both used as an input/output terminal;

an area size of the first lower electrode is generally equal to a total area size of the second and third lower electrodes and the area for isolating the second and third lower electrodes;

an area size of the first upper electrode is generally equal to a total area size of the second and third upper electrodes and the area for isolating the second and third upper electrodes; and a part of the second lower electrode and a part of the second upper electrode are located to face each other.

2. A balanced/unbalanced type coupled FBAR filter according to claim 1, wherein:

an area size of the third lower electrode is generally equal to an area size of the third upper electrode; and the third lower electrode and the third upper electrode are located to be rotation-symmetrical with respect to a central axis in a length direction of the second vibration section.

3. A balanced/unbalanced type coupled FBAR filter according to claim 1, wherein:

the common vibration guaranteeing section is a cavity formed in a substrate.

4. A balanced/unbalanced type coupled FBAR filter according to claim 1, wherein:

the common vibration guaranteeing section is an acoustic mirror layer including a high acoustic impedance layer and a low acoustic impedance layer located alternately.

5. A balanced/balanced type coupled FBAR filter for performing conversion between a balanced signal and a balanced signal using FBARs, the balanced/balanced type coupled FBAR filter comprising:

a first vibration section including an FBAR;

a second vibration section including an FBAR and located parallel to the first vibration section; and a common vibration guaranteeing section, having the first and second vibration sections provided thereon, for commonly guaranteeing a vibration of the first vibration section and a vibration of the second vibration section so as to couple the two vibrations;

wherein:

the first vibration section includes:

a first lower electrode;

a first upper electrode located to face the first lower electrode; and a part of a piezoelectric thin film interposed between the first lower electrode and the first upper electrode;

wherein the first lower electrode and the first upper electrode are both used as an input/output terminal;

the second vibration section includes:

a second lower electrode;

a third lower electrode separated from the second lower electrode by an insulating area;

a second upper electrode located to face a part of the third lower electrode;

a third upper electrode located to face a part of the second lower electrode and separated from the second upper electrode by an insulating area; and another part of the piezoelectric thin film interposed between the second and third lower electrodes and the second and third upper electrodes;

wherein the second lower electrode and the second upper electrode are both used as an input/output terminal;

an area size of the first lower electrode is generally equal to a total area size of the second and third lower electrodes and the area for isolating the second and third lower electrodes;

an area size of the first upper electrode is generally equal to a total area size of the second and third upper electrodes and the area for isolating the second and third upper electrodes; and a part of the second lower electrode and a part of the second upper electrode are located to face each other.

6. A balanced/balanced type coupled FBAR filter according to claim 5, wherein:

an area size of the third lower electrode is generally equal to an area size of the third upper electrode; and the third lower electrode and the third upper electrode are located to be rotation-symmetrical with respect to a central axis in a length direction of the second vibration section.

7. A balanced/balanced type coupled FBAR filter according to claim 5, wherein:

the common vibration guaranteeing section is a cavity formed in a substrate.

8. A balanced/balanced type coupled FBAR filter according to claim 5, wherein:

the common vibration guaranteeing section is an acoustic mirror layer including a high acoustic impedance layer and a low acoustic impedance layer located alternately.

9. A ladder-type filter including a coupled FBAR filter which comprises:

a first vibration section including an FBAR;

a second vibration section including an FBAR and located parallel to the first vibration section; and a common vibration guaranteeing section, having the first and second vibration sections provided thereon, for commonly guaranteeing a vibration of the first vibration section and a vibration of the second vibration section so as to couple the two vibrations;

wherein:

the first vibration section includes:

a first lower electrode;

a first upper electrode located to face the first lower electrode; and a part of a piezoelectric thin film interposed between the first lower electrode and the first upper electrode;

wherein at least one of the first lower electrode and the first upper electrode is used as an input/output terminal;

the second vibration section includes:

a second lower electrode;

a third lower electrode separated from the second lower electrode by an insulating area;

a second upper electrode located to face a part of the third lower electrode;

a third upper electrode located to face a part of the second lower electrode and separated from the second upper electrode by an insulating area; and another part of the piezoelectric thin film interposed between the second and third lower electrodes and the second and third upper electrodes;

wherein the second lower electrode and the second upper electrode are both used as an input/output terminal;

an area size of the first lower electrode is generally equal to a total area size of the second and third lower electrodes and the area for isolating the second and third lower electrodes;

an area size of the first upper electrode is generally equal to a total area size of the second and third upper electrodes and the area for isolating the second and third upper electrodes; and a part of the second lower electrode and a part of the second upper electrode are located to face each other.

10. A duplexer including a coupled FBAR filter which comprises:
a first vibration section including an FBAR;
a second vibration section including an FBAR and located parallel to the first vibration section; and
a common vibration guaranteeing section, having the first and second vibration sections provided thereon, for commonly guaranteeing a vibration of the first vibration section and a vibration of the second vibration section so as to couple the two vibrations;
wherein:
the first vibration section includes:
a first lower electrode;
a first upper electrode located to face the first lower electrode; and
a part of a piezoelectric thin film interposed between the first lower electrode and the first upper electrode;
wherein at least one of the first lower electrode and the first upper electrode is used as an input/output terminal;
the second vibration section includes:
a second lower electrode;
a third lower electrode separated from the second lower electrode by an insulating area;
a second upper electrode located to face a part of the third lower electrode;
a third upper electrode located to face a part of the second lower electrode and separated from the second upper electrode by an insulating area; and
another part of the piezoelectric thin film interposed between the second and third lower electrodes and the second and third upper electrodes;
wherein the second lower electrode and the second upper electrode are both used as an input/output terminal;
an area size of the first lower electrode is generally equal to a total area size of the second and third lower electrodes and the area for isolating the second and third lower electrodes;
an area size of the first upper electrode is generally equal to a total area size of the second and third upper electrodes and the area for isolating the second and third upper electrodes; and
a part of the second lower electrode and a part of the second upper electrode are located to face each other.

11. A communication device including a coupled FBAR filter which comprises:
a first vibration section including an FBAR;
a second vibration section including an FBAR and located parallel to the first vibration section; and
a common vibration guaranteeing section, having the first and second vibration sections provided thereon, for commonly guaranteeing a vibration of the first vibration section and a vibration of the second vibration section so as to couple the two vibrations;
wherein:
the first vibration section includes:
a first lower electrode;
a first upper electrode located to face the first lower electrode; and
a part of a piezoelectric thin film interposed between the first lower electrode and the first upper electrode;
wherein at least one of the first lower electrode and the first upper electrode is used as an input/output terminal;
the second vibration section includes:
a second lower electrode;
a third lower electrode separated from the second lower electrode by an insulating area;
a second upper electrode located to face a part of the third lower electrode;
a third upper electrode located to face a part of the second lower electrode and separated from the second upper electrode by an insulating area; and
another part of the piezoelectric thin film interposed between the second and third lower electrodes and the second and third upper electrodes;
wherein the second lower electrode and the second upper electrode are both used as an input/output terminal;
an area size of the first lower electrode is generally equal to a total area size of the second and third lower electrodes and the area for isolating the second and third lower electrodes;
an area size of the first upper electrode is generally equal to a total area size of the second and third upper electrodes and the area for isolating the second and third upper electrodes; and
a part of the second lower electrode and a part of the second upper electrode are located to face each other.

* * * * *